(12) United States Patent
Manipatruni et al.

(10) Patent No.: US 11,652,487 B1
(45) Date of Patent: May 16, 2023

(54) PARALLEL PULL-UP AND PULL-DOWN NETWORKS CONTROLLED ASYNCHRONOUSLY BY MAJORITY GATE OR MINORITY GATE LOGIC

(71) Applicant: Kepler Computing Inc., San Francisco, CA (US)

(72) Inventors: Sasikanth Manipatruni, Portland, OR (US); Nabil Imam, Atlanta, GA (US); Ikenna Odinaka, Durham, NC (US); Rafael Rios, Austin, TX (US); Rajeev Kumar Dokania, Beaverton, OR (US); Amrita Mathuriya, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

(21) Appl. No.: 17/645,877

(22) Filed: Dec. 23, 2021

Related U.S. Application Data

(63) Continuation of application No. 17/645,840, filed on Dec. 23, 2021.

(51) Int. Cl.
  *H03K 19/23* (2006.01)
  *H03K 19/08* (2006.01)
  *H01L 49/02* (2006.01)

(52) U.S. Cl.
  CPC ......... *H03K 19/23* (2013.01); *H03K 19/0813* (2013.01); *H01L 28/55* (2013.01)

(58) Field of Classification Search
  CPC .......... H03K 19/0027; H01L 27/11502; H01L 28/55; H01L 28/65
  See application file for complete search history.

(56) References Cited

U.S. PATENT DOCUMENTS

| 3,260,863 A | 7/1966 | Burns et al. |
| 3,524,977 A | 8/1970 | Wang |
| 5,381,352 A | 1/1995 | Shou et al. |

(Continued)

FOREIGN PATENT DOCUMENTS

| JP | 2000156472 A | 6/2000 |
| KR | 20160089141 A | 7/2016 |

OTHER PUBLICATIONS

"Kepler Logic", Named for Amalie Emmy Noether @ https://en.wikipedia.org/wiki/Emmy_Noether.

(Continued)

*Primary Examiner* — Daniel D Chang
(74) *Attorney, Agent, or Firm* — Mughal IP P.C.

(57) ABSTRACT

Asynchronous circuits implemented using threshold gate(s) and/or majority gate(s) (or minority gate(s)) are described. The new class of asynchronous circuits can operate at lower power supply levels (e.g., less than 1V on advanced technology nodes) because stack of devices between a supply node and ground are significantly reduced compared to traditional asynchronous circuits. The asynchronous circuits here result in area reduction (e.g., 3× reduction compared to traditional asynchronous circuits) and provide higher throughput/mm² (e.g., 2× higher throughput compared to traditional asynchronous circuits). The threshold gate(s), majority/minority gate(s) can be implemented using capacitive input circuits. The capacitors can have linear dielectric or non-linear polar material as dielectric.

20 Claims, 20 Drawing Sheets

(56) References Cited

U.S. PATENT DOCUMENTS

| | | | |
|---|---|---|---|
| 5,444,411 A * | 8/1995 | Yang | G06G 7/14 |
| | | | 327/566 |
| 5,568,062 A | 10/1996 | Kaplinsky | |
| 5,600,270 A | 2/1997 | Shou et al. | |
| 5,666,080 A * | 9/1997 | Shou | G06J 1/00 |
| | | | 327/354 |
| 5,774,008 A * | 6/1998 | Shou | G06G 7/26 |
| | | | 327/354 |
| 5,818,380 A | 10/1998 | Ito et al. | |
| 5,835,045 A | 11/1998 | Ogawa et al. | |
| 5,926,057 A | 7/1999 | Ogawa et al. | |
| 5,978,827 A | 11/1999 | Ichikawa | |
| 6,043,675 A * | 3/2000 | Miyamoto | H03M 1/145 |
| | | | 326/11 |
| 6,198,652 B1 | 3/2001 | Kawakubo et al. | |
| 6,208,282 B1 | 3/2001 | Miyamoto | |
| 7,837,110 B1 | 11/2010 | Hess et al. | |
| 7,897,454 B2 | 3/2011 | Wang et al. | |
| 8,247,855 B2 | 8/2012 | Summerfelt | |
| 9,276,040 B1 | 3/2016 | Marshall et al. | |
| 9,324,405 B2 | 4/2016 | Evans, Jr. et al. | |
| 9,697,882 B1 | 7/2017 | Evans, Jr. et al. | |
| 9,858,979 B1 | 1/2018 | Derner et al. | |
| 9,973,329 B2 | 5/2018 | Hood et al. | |
| 10,217,522 B2 | 2/2019 | Wang et al. | |
| 2001/0052619 A1 | 12/2001 | Inoue et al. | |
| 2004/0183508 A1 | 9/2004 | Toyoda et al. | |
| 2013/0214814 A1 * | 8/2013 | Singh | H03K 19/094 |
| | | | 326/36 |
| 2015/0337983 A1 | 11/2015 | Dolenti et al. | |
| 2017/0337983 A1 | 11/2017 | Wang et al. | |
| 2018/0076815 A1 | 3/2018 | Vigeant et al. | |
| 2019/0074295 A1 | 3/2019 | Schröder | |
| 2019/0318775 A1 | 10/2019 | Rakshit et al. | |
| 2019/0348098 A1 | 11/2019 | El-Mansour et al. | |
| 2020/0091414 A1 | 3/2020 | Liu et al. | |
| 2020/0210233 A1 | 7/2020 | Chen et al. | |

OTHER PUBLICATIONS

Fichtner, S. et al., "AlScN: A III-V semiconductor based ferroelectric", Journal of Applied Physics 125, 114103 (2019); https://doi.org/10.1063/1.5084945, 2019, 28 pages.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., "Threshold Logic and its Applications", New York, Wiley-Interscience. published 1971.

Nowick et al., "Asynchronous Design—Part 1: Overview and Recent Advances." IEEE Design & Test (vol. 32, Issue: 3, Jun. 2015).

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

Sutherland et al., "Computers without Clocks," Scientific American. Aug. 1, 2002;287(2):62-69.

Dou et al., "An Overview of Linear Dielectric Polymers and Their Nanocomposites for Energy Storage," Molecules. Oct. 2021; 26(20): 6148. (15 pages).

Final Office Action notified Feb. 8, 2023 for U.S. Appl. No. 17/645,840.

Final Office Action notified Feb. 8, 2023 for U.S. Appl. No. 17/645,872.

Final Office Action notified Feb. 8, 2023 for U.S. Appl. No. 17/645,911.

Final Office Action notified Feb. 8, 2023 for U.S. Appl. No. 17/645,912.

Final Office Action notified Feb. 9, 2023 for U.S. Appl. No. 17/645,913.

Non-Final Office Action notified Dec. 21, 2022 for U.S. Appl. No. 17/645,840.

Non-Final Office Action notified Dec. 21, 2022 for U.S. Appl. No. 17/645,864.

Non-Final Office Action notified Dec. 29, 2022 for U.S. Appl. No. 17/645,872.

Non-Final Office Action notified Dec. 29, 2022 for U.S. Appl. No. 17/645,911.

Non-Final Office Action notified Dec. 30, 2022 for U.S. Appl. No. 17/645,912.

Non-Final Office Action notified Jan. 19, 2023 for U.S. Appl. No. 17/645,913.

Notice of Allowance notified Feb. 27, 2023 for U.S. Appl. No. 17/645,840.

Notice of Allowance notified Feb. 28, 2023 for U.S. Appl. No. 17/645,872.

Notice of Allowance notified Feb. 28, 2023 for U.S. Appl. No. 17/645,911.

Notice of Allowance notified Jan. 17, 2023 for U.S. Appl. No. 17/645,910.

Notice of Allowance notified Jan. 25, 2023 for U.S. Appl. No. 17/645,64.

Notice of Allowance notified Mar. 13, 2023 for U.S. Appl. No. 17/645,912.

Ulrich et al., "Comparison of Paraelectric and Ferroelectric Materials for Applications as Dielectrics in Thin Film Integrated Capacitors," International Journal of Microcircuits and Electronic Packaging 23.2 (2000): 172-181 (9 pages).

* cited by examiner

PARALLEL PULL-UP AND PULL-DOWN NETWORKS CONTROLLED ASYNCHRONOUSLY BY MAJORITY GATE OR MINORITY GATE LOGIC

CLAIM OF PRIORITY

This application is a continuation application and claims benefit of priority of U.S. patent application Ser. No. 17/645,840 titled "ASYNCHRONOUS CIRCUIT WITH THRESHOLD LOGIC," filed Dec. 23, 2021, and which is incorporated by reference in its entirety.

BACKGROUND

Logic circuits can be categorized as synchronous logic or asynchronous logic. Synchronous logic uses a global clock circuit to synchronize various logic components. For example, outputs of a combinational logic block are sampled by latches or flip-flops by a clock to generate synchronized data. Asynchronous logic does not use a global clock to synchronize its various logic components. Instead, asynchronous logic use handshaking protocols as data propagates from one logic component to another.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Some embodiments describe asynchronous circuits using threshold gate(s) and/or majority gate(s) (or minority gate(s)) are described. The new class of asynchronous circuits can operate at lower power supply levels (e.g., less than 1V on advanced technology nodes) because stack of devices between a supply node and ground are significantly reduced compared to traditional asynchronous circuits. The asynchronous circuits here result in area reduction (e.g., 3× reduction compared to traditional asynchronous circuits) and provide higher throughput/mm² (e.g., 2× higher throughput compared to traditional asynchronous circuits). The threshold gate(s), majority/minority gate(s) can be implemented using capacitive input circuits. The capacitors of the capacitive input circuits can have linear dielectric or non-linear polar material (e.g., paraelectric or ferroelectric) as dielectric. The asynchronous circuits can have threshold gate(s), majority or minority gates, or combination of them that drive pull-up and/or pull-down networks. While the circuits here are described with reference to asynchronous circuits, the circuits can also be used in synchronous circuits. For example, combination logic associated with synchronous circuits can use the asynchronous circuits discussed herein. In some embodiments, input signals to threshold or majority gates can be clock signals, which allow these asynchronous circuits to operate as synchronous circuits.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

Figure 1:
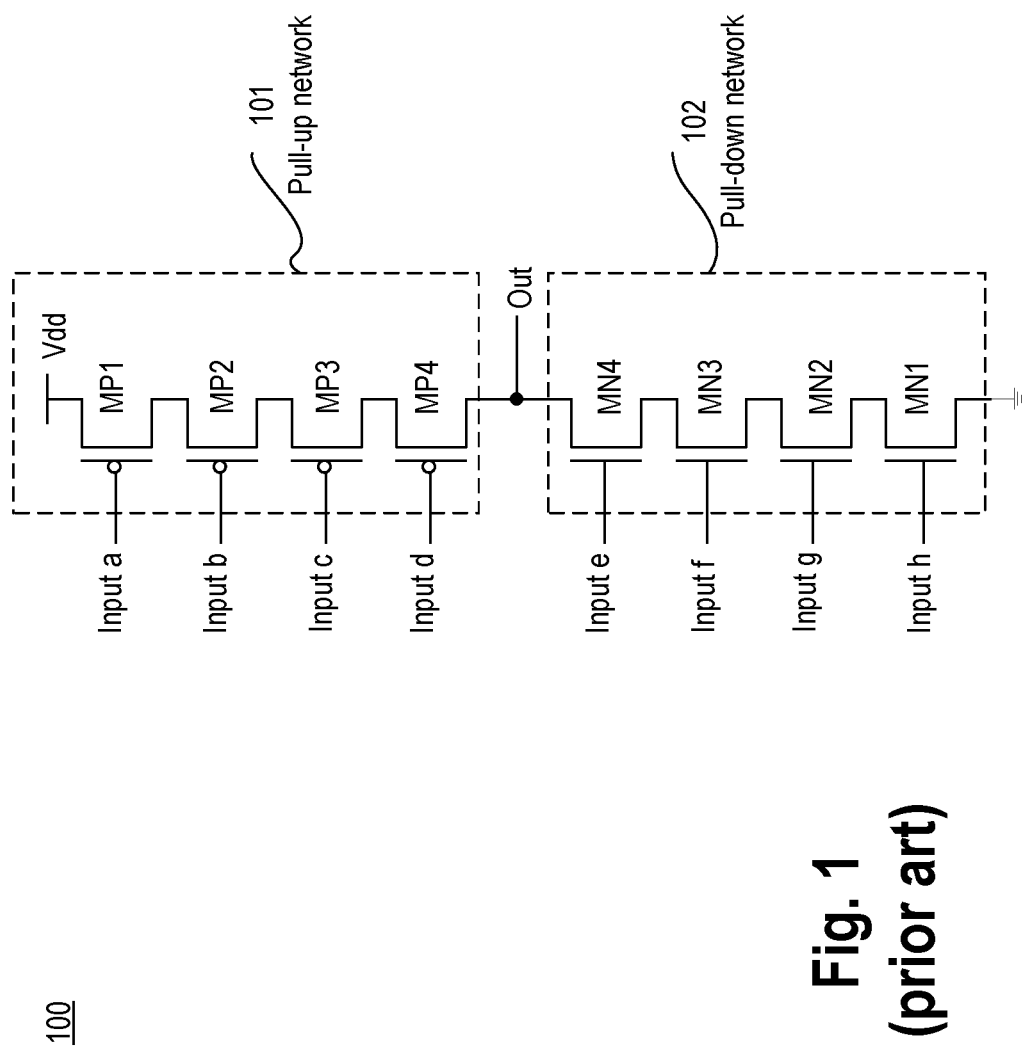
FIG. 1 illustrates a traditional asynchronous circuit with a pull-up network and a pull-down network each having a stack of serially coupled transistors.

FIG. 1 illustrates a traditional asynchronous circuit 100 with a pull-up network and a pull-down network each having a stack of serially coupled transistors. Asynchronous circuit 100 consists of pull-up network 101 coupled in series with pull-down network 102. As discussed herein, asynchronous circuits operate in the absence of clock. In this example, pull-up network 101 is connected between power supply rail Vdd and output node out. An individual transistor of pull-up network 101 is controlled by a respective input, which is an asynchronous input. For example, p-type transistor MP1 has a gate terminal controllable by input 'a', p-type transistor MP2 has a gate terminal controllable by input 'b', p-type transistor MP3 has a gate terminal controllable by input 'c', p-type transistor MP4 has a gate terminal controllable by input 'd', where transistors MP1, MP2, MP3, and MP4 are coupled in series. In this example, pull-up network 101 is connected between ground supply rail Vss and output node "out". An individual transistor of pull-up network 101 is controlled by a respective input. For example, n-type transistor MN4 has a gate terminal controllable by input 'e', n-type transistor MN3 has a gate terminal controllable by input 'f', n-type transistor MN2 has a gate terminal controllable by input 'g', n-type transistor MN1 has a gate terminal controllable by input 'h', where transistors MN1, MN2, MN3, and MN4 are coupled in series.

While pull-up network 101 and pull-down network 102 are shown having four transistors in series, asynchronous circuits may have many more transistors in series. The series coupled transistors from Vdd to ground may need high-level of power supply (e.g., higher Vdd) to provide headroom for each transistor in the stack to operate. As such, the stack of transistors for asynchronous circuits are not suitable for low power supply operation (e.g., 1V or below when the threshold of each transistor in the stack is about 300 mV). Various embodiments reduce the size of the stack for the pull-up and pull-down networks by using threshold or majority (or minority) gates to drive gates of transistors in the reduced stack.

Figures 2A, 2B:
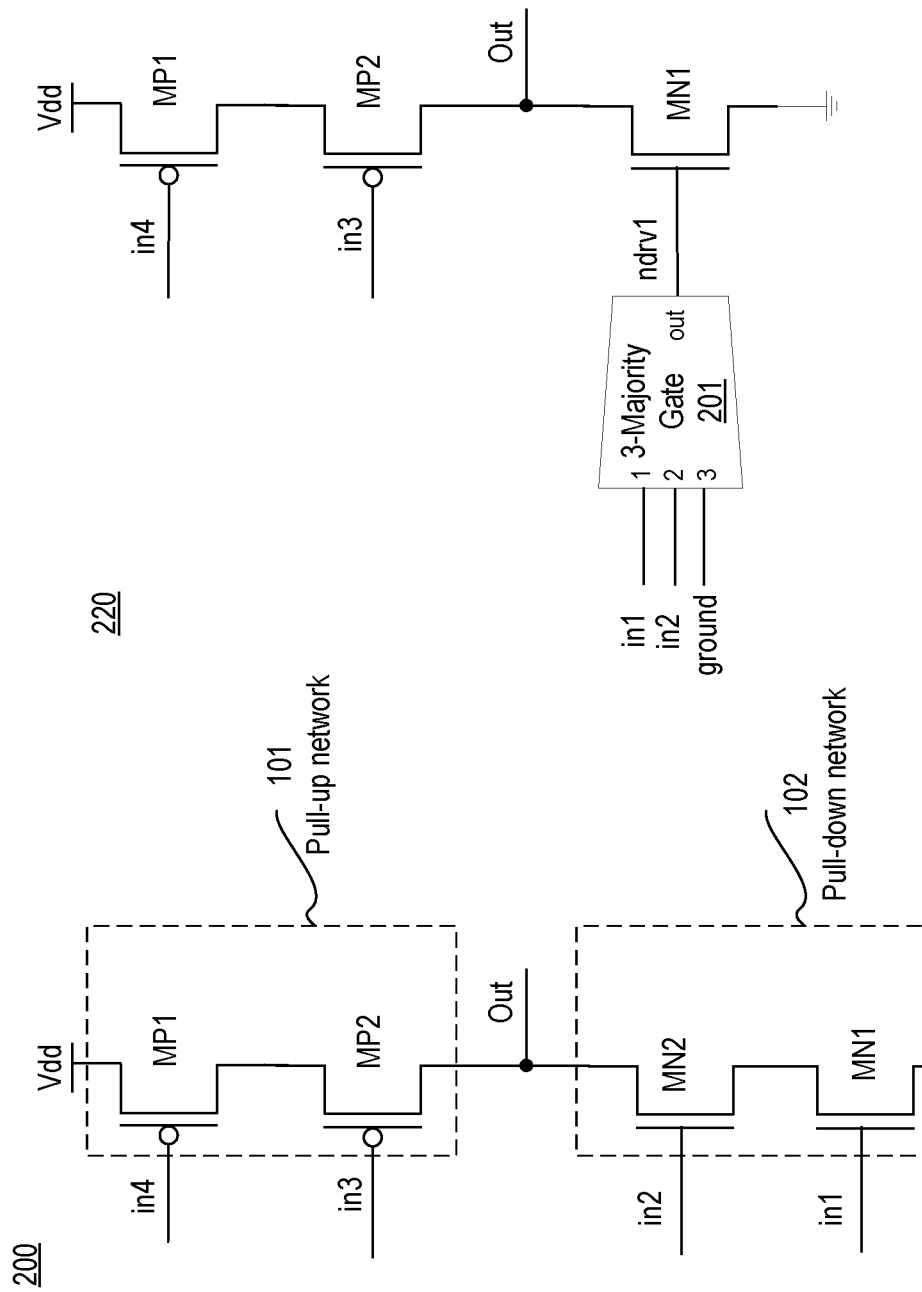
FIG. 2A illustrates a traditional asynchronous circuit with a 2-input pull-up network and a 2-input pull-down network each having a stack of serially coupled transistors.
FIG. 2B illustrates an asynchronous circuit where the 2-input pull-down network is converted to a 1-input pull-down network driven by a majority gate, in accordance with some embodiments.

FIG. 2A illustrates traditional asynchronous circuit 200 with a 2-input pull-up network and a 2-input pull-down network each having a stack of serially coupled transistors. Compared to asynchronous circuit 100, where pull-up network 101 includes two p-type transistors MP1 and MP2 driven by inputs in4 and in3, respectively. Here, pull-down network 102 includes two p-type transistors MN1 and MN2 driven by inputs in1 and in3, respectively. The common node "out" which is common to pull-up network 101 and pull-down network 102 is used to drive the output based on the inputs in1, in2, in3, and in4.

FIG. 2B illustrates asynchronous circuit 220 where 2-input pull-down network 102 is converted to a 1-input pull-down network driven by a majority gate, in accordance with some embodiments. Pull-down network 102 had transistors MN1 and MN2, which are converted to a single transistor MN1 with a gate terminal driven by a 3-input majority gate 201, in accordance with some embodiments. In some embodiments, the 3-input majority gate 201 can be converted into a 2-input threshold gate with a threshold of 2.

In some embodiments, 3-input majority gate comprises three input capacitors, where an individual capacitor has a first terminal coupled to an input and a second terminal coupled to a summing node (or a common node). For example, a first capacitor C1 has a first terminal (1) coupled to input in1 and a second terminal coupled to summing node n1, a second capacitor C2 has a first terminal (2) coupled to input in1 and a second terminal coupled to the summing node n1, and a third capacitor C3 has a first terminal (3) coupled to input ground and a second terminal coupled to the summing node n1. In various embodiments, 3-input majority gate 201 is configured as a AND gate that performs an AND function of inputs in1 and in2 but realized as a 3-input majority gate. Examples of majority gates are described with reference to FIGS. 11-13.

Referring to FIG. 2B, the output "out" of majority gate 201 is ndrv1 which drives or controls when transistor MN1 turns on/off. In this embodiment, the stack of transistors is reduced from four to three, thereby improving headroom for the asynchronous circuit. For a chain of n-type devices (e.g., MN1 and MN2), the inputs (e.g., in1 and in2) to the transistors are expected to have logic 1 to turn on the path from node out to ground (Vdd). In some embodiments, this function is realized as an AND gate that generates an AND function of inputs (e.g., in1 and in2) to drive an n-type transistor to cause an electrical path from Out to ground. In this example, 3-input majority gate 201 generates ndrv1 to drive a gate of transistor MN1 according to an AND function of inputs in1 and in2. The AND function is a majority logic function of inputs in1, in2, and ground.

In some embodiments, for a chain of p-type devices (e.g., MP1 and MP2), the inputs (e.g., in3 and in4) to the gate of the transistors are expected to have logic 0 to turn on the path from Vdd to out. In some embodiments, this function is realized as an OR gate that generates an OR function of inputs (e.g., in3 and in4) to drive p-type transistor to cause an electrical path from Vdd to Out. In some embodiments, transistors MP1 and MP2 can be replaced by a p-type transistor whose gate terminal is driven by a 3-input majority gate (not shown) that generates an OR function of inputs in3 and in4.

Figure 3A:
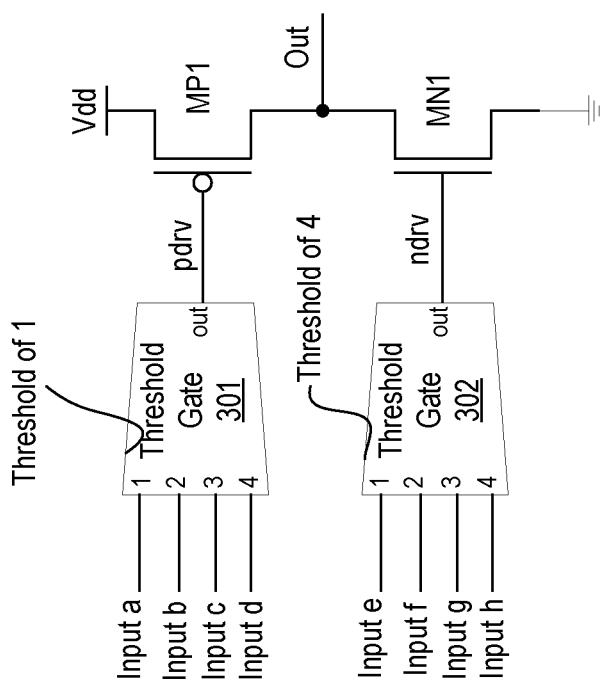
FIG. 3A illustrates an asynchronous circuit where a 4-input pull-up network is converted to a 1-input pull-up network driven by a threshold gate, and where a 4-input pull-down network is converted to a 1-input pull-down network driven by a threshold gate, in accordance with some embodiments.

FIG. 3A illustrates asynchronous circuit 300 where a 4-input pull-up network is converted to a 1-input pull-up network driven by a threshold gate, and where a 4-input pull-down network is converted to a 1-input pull-down network driven by a threshold gate, in accordance with some embodiments. Asynchronous circuit 100 is converted to asynchronous circuit 300 by reducing the stack of series connected devices in pull-up network 101 and pull-down network 102 from four devices to one device each in the respective stacks. For example, here the pull-up network comprises transistor MP1 coupled to the supply rail Vdd and the output "out", where the gate of the MP1 is driven by prdv. In this example, the stack of p-type transistors MP1, MP2, MP3, and MP4 in pull-up network 101 is reduced to p-type transistor MP1 whose gate is driven by prdv.

In some embodiments, the pull-down network comprises transistor MN1 coupled to the ground supply rail Vss and the output "out", where the gate of the MN1 is driven by nrdv. In this example, the stack of n-type transistors MN1, MN2, MN3, and MN4 in pull-down network 102 is reduced to n-type transistor MN1 whose gate is driven by nrdv.

In some embodiments, prdv is generated by threshold gate 301 with a threshold of 1. Here, a threshold of 1 means that prdv will be a logic 1 value when at least one of the inputs 'a', 'b', 'c', or 'd' is a logic 1. This also means that when all inputs are logic 0, then the output prdv is a logic 0, which turns on gate MP1. Referring to FIG. 1, where inputs 'a', 'b', 'c'. and 'd' all have to be at logic 0 to turn on pull-up network 101, in some embodiments, threshold gate 301 is configured as an OR gate by adjusting its threshold to 1.

In some embodiments, nrdv is generated by threshold gate 302 with a threshold of 4. Here, a threshold of 4 means that nrdv will be a logic 1 value when all the inputs 'e', 'f', 'g', or 'h' are at logic 1. This also means that when any of the inputs 'e', 'f', 'g', or 'h' is a logic 0, then the output nrdv is a logic 0, which turns off gate MN1. Referring to FIG. 1, where inputs 'e', 'f', 'g', or 'h' all are expected to be at logic 1 to turn on pull-down network 102, in some embodiments, threshold gate 302 is configured as an AND gate by adjusting its threshold to 4. Examples of adjustable threshold gates are described with reference to FIGS. 11-13.

Figure 3B:
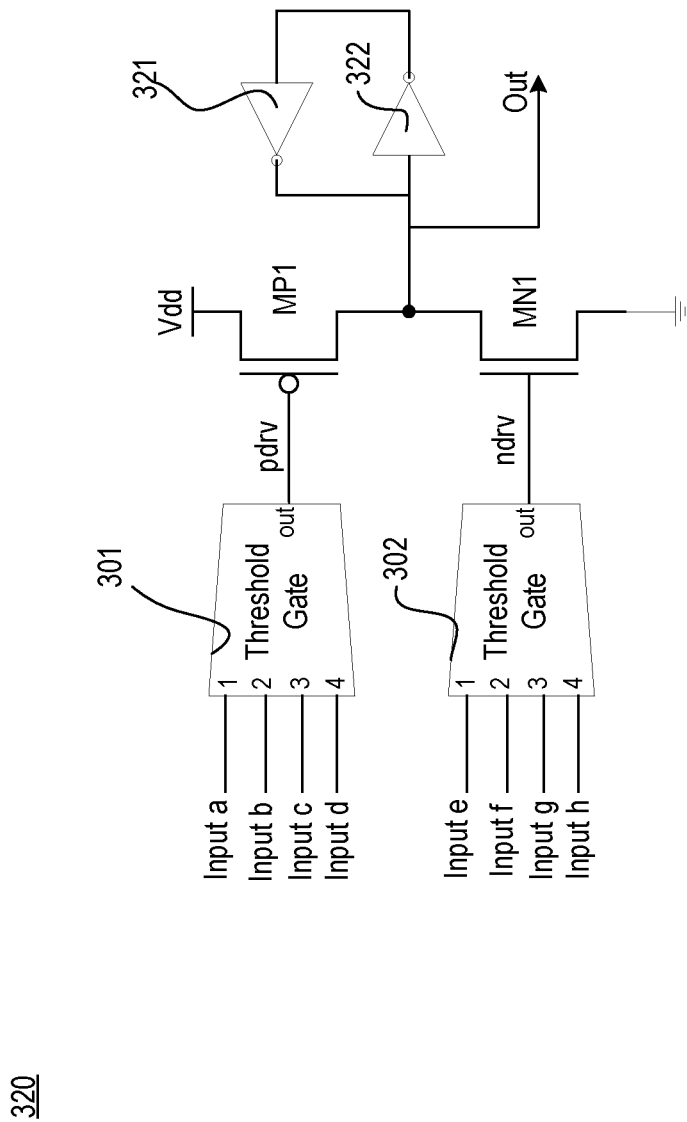
FIG. 3B illustrates an asynchronous circuit of FIG. 3A with a memory element at its output, in accordance with some embodiments.

FIG. 3B illustrates asynchronous circuit 320 where the asynchronous circuit of FIG. 3A is coupled to a memory element at its output, in accordance with some embodiments. In some embodiments, the logic value on node "out" (coupled to drain terminals of transistors MP1 and MN1) is coupled to a memory element. In some embodiments, the memory element comprises cross-coupled inverters 321 and 322 that are connected or coupled in a ring formation. The cross-coupled inverters 321 and 322 hold the logic value on node out when transistors MP1 and MN1 are off. In various embodiments, the drive strength of transistors MP1 and MN2 is stronger than the drive strength of inverter 321 to allow transistors MP1 or MN1 to change the logic value of node "out" irrespective of what logic level inverter 321 is driving. In some embodiments, inverters 321 and/or 322 can be replaced with any equivalent inverting circuitry. For example, inverters 321 and/or 322 can be replaced with NAND or NOR gates that are configured as inverters. As such, the output "out" can be reset or preset by the NAND or NOR gates. In some embodiments, inverters 321 and/or 322 are CMOS based circuitries.

Figure 3C:
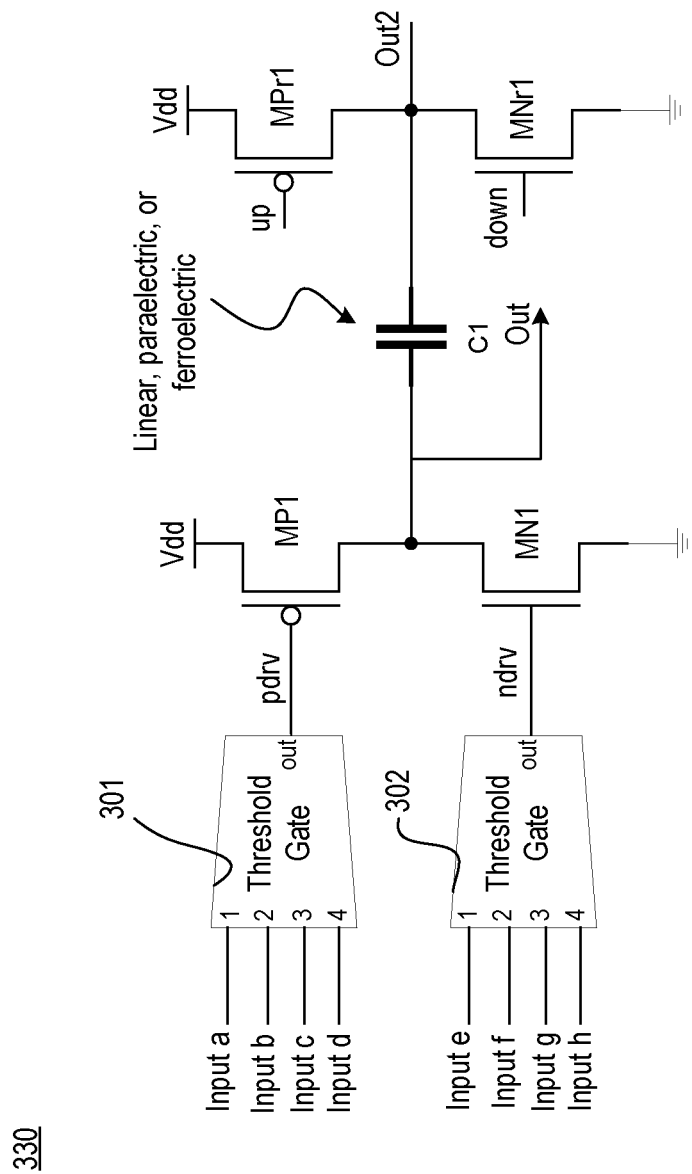
FIG. 3C illustrates an asynchronous circuit of FIG. 3A with 1-input threshold gate at its output, in accordance with some embodiments.

FIG. 3C illustrates asynchronous circuit 330 of FIG. 3A with a 1-input threshold gate at its output, in accordance with some embodiments. In some embodiments, the 1-input threshold gate comprises capacitor C1 having a first terminal coupled to node out and a second terminal coupled to out2. In some embodiments, depending on the type of capacitor, pull-up device MPr1 is coupled to node out2 and supply rail Vdd, and controllable by up signal. In some embodiments, depending on the type of capacitor, pull-down device MPr2 is coupled to node out2 and supply rail ground (Vss), and controllable by down signal. In various embodiments, the 1-input threshold gate is independent of a feedback loop and is configured to store the state of logic on node "out2" for a period. The 1-input threshold gate is a 1-input capacitive circuit with a threshold of 1, which allows the 1-input threshold gate to operate as a latch when the input "out" is floating. During its latch configuration, the previous logic value on "out2" is preserved. This preservation of the logic state may depend on leakage attributes of the various transistors coupled to node "out2".

In some embodiments, the 1-input capacitive circuit can be configured to a threshold of 1 during a reset phase. In the reset phase, the threshold of 1-input capacitive circuit is programmed by setting logic level for "out" and the on/off condition for pull-up and pull-down devices (MPr1 and MNr1). For the 1-input capacitive circuit with pull-up device MPr1 and no pull-down device MNr1, the information about the second control (down) is not used. For the 1-input capacitive circuit with pull-down device MNr1 and no pull-up device MPr1, the information about the first control (up) is not used. In some embodiments, capacitor C1 is a linear capacitor (e.g., comprises linear dielectric).

In some embodiments, a conditioning circuitry (not shown) sets the threshold to 1 for the 1-input capacitive circuit by controlling which of ne MPr1 or MNr1 will be on/off during a reset phase. In some embodiments, the value on "out" is either driven by transistors MP1 or MN1. For example, inputs 'a', 'b', 'c', 'd', 'e', 'f', 'g', and/or 'h' are set to cause MP1 or MN1 to drive a particular logic value on node out during a reset phase (e.g., a phase when up or down are activated to turn on or off one of MPr1 or MNr1). In some embodiments, transistors MP1 or MN1 are off, and another device (or set of devices) are used to inject a logic 1 or logic 0 to node "out" to program the threshold of the 1-input capacitive circuit. In some embodiments, in an evaluation phase, if the threshold is 1 for the 1-input capacitive circuit, then logic value of node "out2" is 1 when the last know logic value of "out" is logic 1, and it's a 0 when the last known logic value of "out" is logic 0.

Table 1 summarizes the logic function for a 1-input capacitive circuit after its threshold is programmed.

TABLE 1

| Threshold | Logic Function on node "out2" |
| --- | --- |
| 1 | Buffer |

In some embodiments, the 1-input capacitive circuit comprises a paraelectric capacitor C1 instead of a linear capacitor C1. Table 2 and Table 3 describe the programmability of 1-input capacitive circuit that comprises paraelectric capacitor C1. Table 3 illustrates the threshold adjustment or programmed value for input setting of "out" and on/off condition for pull-up and pull-down devices (MPr1 and MNr1). For the 1-input capacitive circuit with pull-up device MPr1 and no pull-down device MNr1, information about the second control "down" is not used. For the 1-input capacitive circuit with pull-down device MNr1 and no pull-up device MPr1, the information about the first control "up" is not used.

TABLE 2

| "out" | First control "up" | Second control "down" | Threshold |
|---|---|---|---|
| 1 | 0 (enable MP1) | 0 (disable MN1) | 1 |
| "out" | Second control "down" | First control "up" | Threshold |
| 0 | 1 (enable MN1) | 1 (disable MP1) | 1 |

In some embodiments, a conditioning circuitry sets the threshold to 1 by enabling or turning on the pull-up device MP1, disabling or turning off the pull-down device MN1 and providing input 1 to input "out." In some embodiments, a conditioning circuitry sets the threshold to 1 by enabling or turning on the pull-down device MN1, disabling or turning off the pull-up device MP1 and providing input 0 to input "out." In some embodiments, in the evaluation phase, if the threshold is 1 for the 1-input capacitive circuit, then the 1-input capacitive circuit behaves as a buffer (or an always on pass-gate). As such, the logic value on node n1 is the same as the logic value at the input terminal of capacitor C1 (e.g., the terminal that is not connected to node "out" of this circuit).

In some embodiments, the value on "out" is either driven by transistors MP1 or MN1. For example, inputs 'a', 'b', 'c', 'd', 'e', 'f', 'g', and/or 'h' are set to cause MP1 or MN1 to drive a particular logic value on node out during a reset phase (e.g., a phase when up or down are activated to turn on or off one of MPr1 or MNr1). In some embodiments, transistors MP1 or MN1 are off, and another device (or set of devices) are used to inject a logic 1 or logic 0 to node "out" to program the threshold of the 1-input capacitive circuit. In some embodiments, in the evaluation phase, if the threshold is 1 for the 1-input capacitive circuit, then logic value of node "out2" follows the previous logic value on node "out".

Table 3 summarizes the logic function for a 1-input capacitive circuit after its threshold is programmed.

TABLE 3

| Threshold | Logic Function on node "out2" |
|---|---|
| 1 | Buffer |

In some embodiments, the 1-input capacitive circuit comprises a ferroelectric capacitor C1 instead of a linear capacitor C1. In some embodiment, inputs 'a', 'b', 'c', 'd', 'e', 'f', 'g', and/or 'h' are set to cause IP or MN1 to drive a particular logic value on node out during a reset phase (e.g., a phase when up or down are activated to turn on or off one of MPr1 or MNr1). Table 4 and Table 5 describe the programmability of 1-input capacitive circuit that comprises ferroelectric capacitor C1. Table 5 illustrates the threshold adjustment or programmed value input setting of "out" and on/off condition for pull-up and pull-down devices (MPr1 and MNr1). Here, the time events T1, T2, and T2 may be separated by a few Gigahertz depending on the material used for the ferroelectric capacitors and the leakage effects on node out. Event T1 occurs first, then T2, and then T3.

TABLE 4

| "out" | Time event T1 | Timing event T2 | Time event T3 | Threshold |
|---|---|---|---|---|
| 1 | 1 (enable MN1) | 0 (disable MN1) | 0 (enable MP1) | 1 |
| 0 | 0 (enable MP1) | 1 (disable MP1) | 1 (enable MN1) | 1 |

In some embodiments, a conditioning circuitry sets the threshold to 1 for the 1-input capacitive circuit by first enabling or turning on the pull-down device MNr1 at time event T1, then disabling or turning off the pull-down device MNr1 at time event T2, and then enabling or turning on the pull-up device MPr1 at time event T3 and providing input 1 to input "out." In some embodiments, a conditioning circuitry sets the threshold to 1 for the 1-input capacitive circuit by first enabling or turning on the pull-up device MPr1 at time event T1, then disabling or turning off the pull-up device MPr1 at time event T2, and then enabling or turning on the pull-down device MNr1 at time event T3 and providing input 0 to input "out." In some embodiments, in the evaluation phase, if the threshold is 1 for the 1-input capacitive circuit, then the 1-input capacitive circuit behaves as a buffer (or an always on pass-gate). As such, the logic value on node "out2" is the same as the logic value at the input terminal (out) of capacitor C1 (e.g., the terminal that is not connected to node n1 of this circuit). Table 5 summarizes the logic function for a 1-input capacitive circuit after its threshold is programmed.

TABLE 5

| Threshold | Logic Function on node "out2" |
|---|---|
| 1 | Buffer |

Figure 4A:
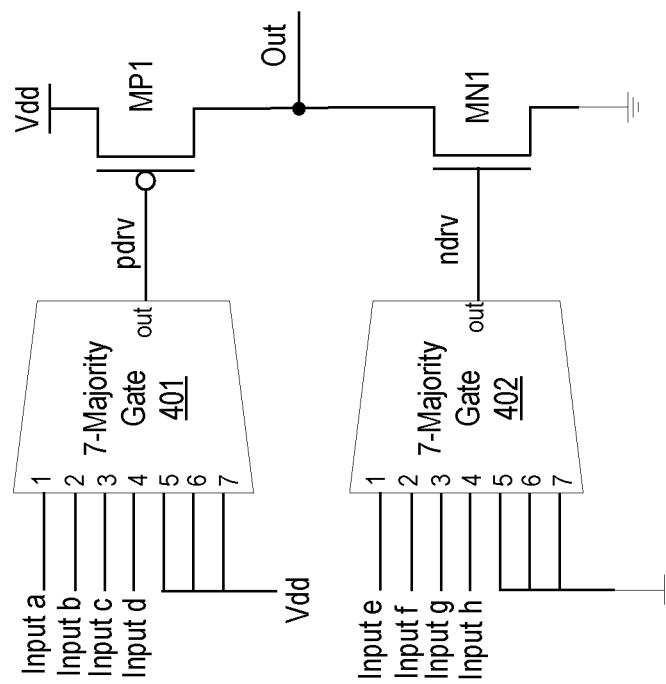
FIG. 4A illustrates an asynchronous circuit where a 4-input pull-up network is converted to a 1-input pull-up network driven by a majority gate, and where a 4-input pull-down network is converted to a 1-input pull-down network driven by a majority gate, in accordance with some embodiments.

FIG. 4A illustrates asynchronous circuit 400 where a 4-input pull-up network is converted to a 1-input pull-up network driven by a majority gate, and where a 4-input pull-down network is converted to a 1-input pull-down network driven by a majority gate, in accordance with some embodiments. Asynchronous circuit 400 is like asynchronous circuit 300 but with a 7-input majority gate driving the pull-up and pull-down transistors. In some embodiments, the AND function of 4-input threshold gate 301 is realized as 7-input majority gate 401 where three of the inputs 5, 6, and 7 are tied to Vdd to produce an OR function at the output pdrv. In some embodiments, the AND function of 4-input threshold gate 302 is realized as 7-input majority gate 402, where three of the inputs 5, 6, and 7 are tied to ground to produce an AND function at the output ndrv.

In some embodiments, prdv is generated by 7-input majority gate 401. Here, prdv will be a logic 1 value when at least one of the inputs 'a', 'b', 'c', or 'd' is a logic 1. This also means that when inputs 'a', 'b', 'c', or 'd' are logic 0, then the output prdv is a logic 0, which turns on gate MP1. Referring to FIG. 1, where inputs 'a', 'b', 'c'. and 'd' all have to be at logic 0 to turn on pull-up network 101, in some embodiments, 7-input majority gate 401 is configured as an OR gate.

In some embodiments, nrdv is generated by 7-input majority gate 402. Here, nrdv will be a logic 1 value when the inputs 'e', 'f', 'g', or 'h' are at logic 1. This also means that when any of the inputs 'e', 'f', 'g', or 'h' is a logic 0, then the output nrdv is a logic 0, which turns off gate MN1. Referring to FIG. 1, where inputs 'e', 'f', 'g', or 'h' all are expected to be at logic 1 to turn on pull-down network 102, in some embodiments, 7-input majority gate 402 is configured as an AND gate.

Figure 4B:
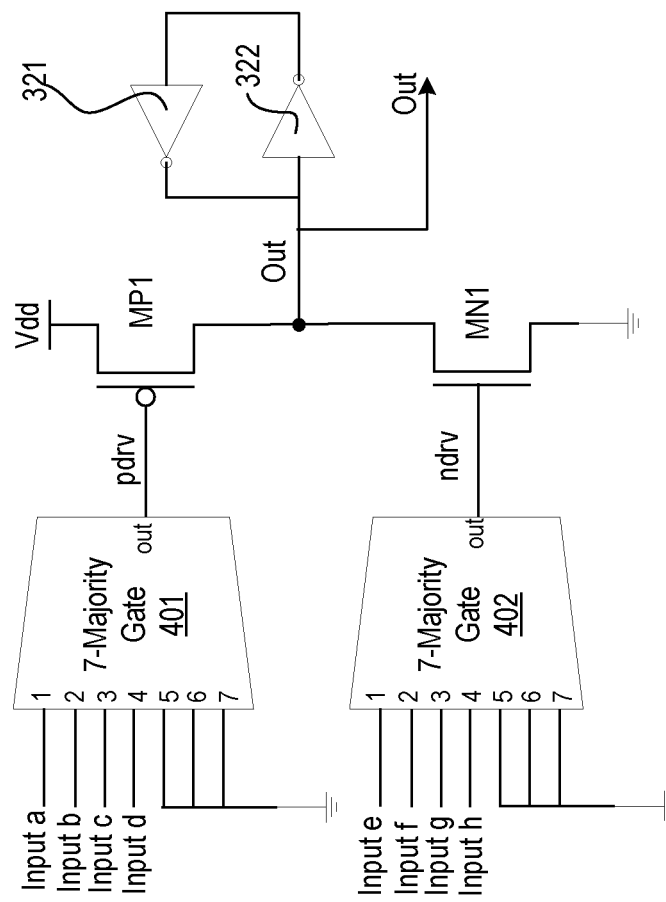
FIG. 4B illustrates an asynchronous circuit of FIG. 4A with a memory element at its output, in accordance with some embodiments.

FIG. 4B illustrates asynchronous circuit 420 where the asynchronous circuit of FIG. 4A is coupled to a memory element at its output, in accordance with some embodiments. FIG. 4B is like FIG. 3B, but with a memory circuit at the output node "out". In some embodiments, the memory element comprises cross-coupled inverters 321 and 322 that are connected or coupled in a ring formation. In some embodiments, inverters or inversion circuitries 321 and/or 322 can be replaced with any equivalent inverting circuitry. For example, inverters 321 and/or 322 can be replaced with NAND or NOR gates that are configured as inverters. As such, the output "out" can be reset or present by the NAND or NOR gates. In some embodiments, inverters 321 and/or 322 are CMOS based circuitries. In some embodiments, inverters 321 and/or 322 are implemented as threshold gates.

Figure 4C:
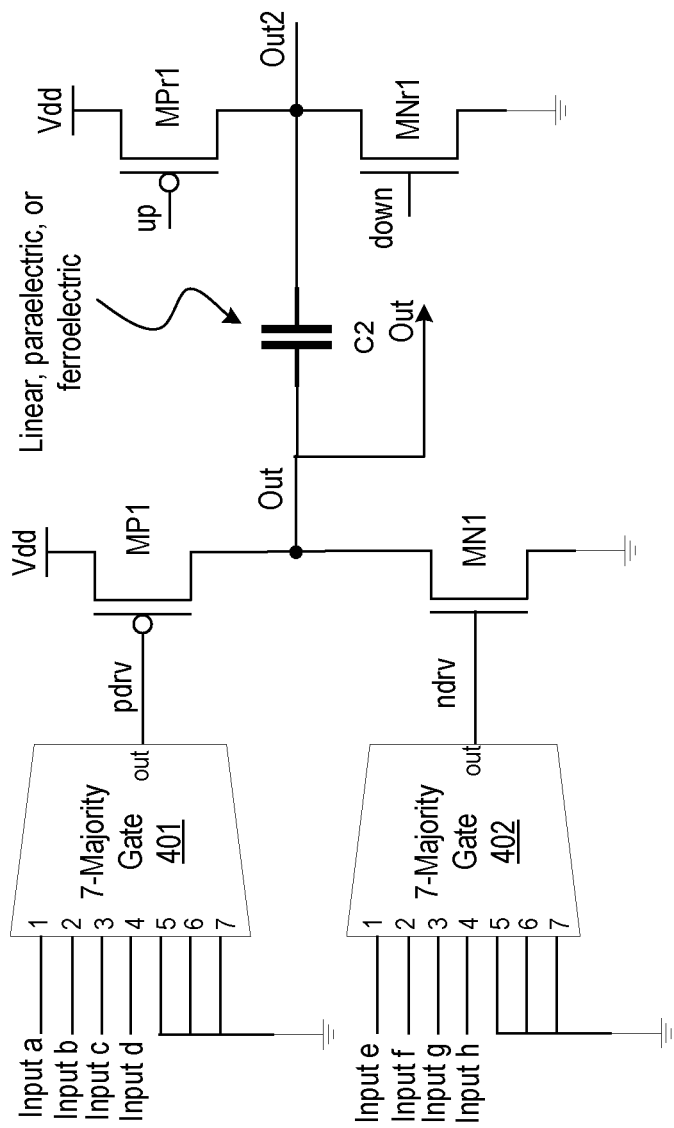
FIG. 4C illustrates an asynchronous circuit of FIG. 4A with a 1-input threshold gate at its output, in accordance with some embodiments.

FIG. 4C illustrates asynchronous circuit 430 of FIG. 4A with a 1-input threshold gate at its output, in accordance with some embodiments. In various embodiments, the 1-input threshold gate is independent of a feedback loop and is configured to store the state of logic on node "out2" for a period. In some embodiments, the 1-input threshold gate is 1-input capacitive circuit whose threshold is programmed to 1 as discussed with reference to FIG. 3C.

Figure 5:
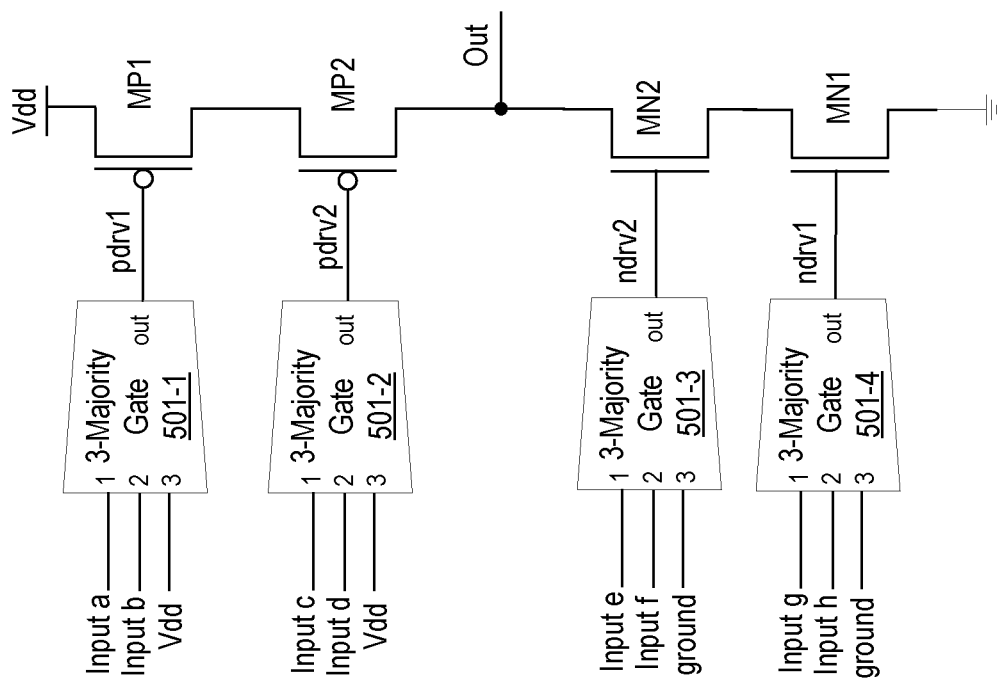
FIG. 5 illustrates an asynchronous circuit comprising a 2-input pull-up stack driven by two majority gates, and 2-input pull-down stack driven by two majority gates, in accordance with some embodiments.

FIG. 5 illustrates asynchronous circuit 500 comprising a 2-input pull-up stack driven by two majority gates, and 2-input pull-down stack driven by two majority gates, in accordance with some embodiments. In some embodiments, instead of reducing the number of devices per stack of circuit 100 (e.g., per pull-up network 101 and pull-down network 102) from four transistors to one transistor, pull-up network 101 and pull-up network 101 here have two devices each. For example, pull-up network 101 includes p-type devices MP1 and MP2, while pull-down network 102 includes n-type devices MN1 and MN2.

In some embodiments, 3-input majority gate 501-1 drives pdrv1 to gate of MP1 according to logic levels of input 'a' and input 'b'. In various embodiments, a third input '3' of 3-input majority gate 501-1 is connected to supply Vdd to configure 3-input majority gate 501-1 as a OR gate. This means when any of the inputs 'a' or 'b' is logic 1, pdrv1 is a logic 1, which keeps MP1 off. As such, MP1 turns on when both inputs 'a' and 'b' are logic 0.

In some embodiments, 3-input majority gate 501-2 drives pdrv2 to gate of MP2 according to logic levels of input 'c' and input 'd'. In various embodiments, a third input '3' of 3-input majority gate 501-2 is connected to supply Vdd to configure 3-input majority gate 501-2 as a OR gate. This means when any of the inputs 'c' or 'd' is logic 1, pdrv2 is a logic 1, which keeps MP2 off. As such, MP2 turns on when both inputs 'c' and 'd' are logic 0.

In some embodiments, 3-input majority gate 501-3 drives ndrv2 to gate of MN2 according to logic levels of input 'e' and input 'f'. In various embodiments, a third input '3' of 3-input majority gate 501-3 is connected to ground supply Vss to configure 3-input majority gate 501-3 as an AND gate. This means when any of the inputs 'e' or 'f' is logic 0, ndrv2 is a logic 0, which keeps MN2 off. As such, MN2 turns on when both inputs 'e' and 'f' are logic 1.

In some embodiments, 3-input majority gate 501-4 drives ndrv1 to gate of MN1 according to logic levels of input 'g' and input 'h'. In various embodiments, a third input '3' of 3-input majority gate 501-4 is connected to ground supply Vss to configure 3-input majority gate 501-4 as an AND gate. This means when any of the inputs 'g' or 'h' is logic 0, ndrv1 is a logic 0, which keeps MN1 off. As such, MN1 turns on when both inputs 'g' and 'h' are logic 1.

In some embodiments, a memory element is connected or coupled to the output node out. In some embodiments, the memory element is like the memory element of FIG. 3B and FIG. 4B. For example, the memory element comprises cross-coupled inverters 321 and 322 that are connected or coupled in a ring formation.

In various embodiments, a 1-input threshold gate (or 1-input capacitive circuit) is connected or coupled to the output node "out". In some embodiments, the 1-input threshold gate is independent of a feedback loop and is configured to store the state of logic on node "out2" for a period. In some embodiments, the 1-input threshold gate is 1-input capacitive circuit whose threshold is programmed to 1 as discussed with reference to FIG. 3C.

Figure 6:
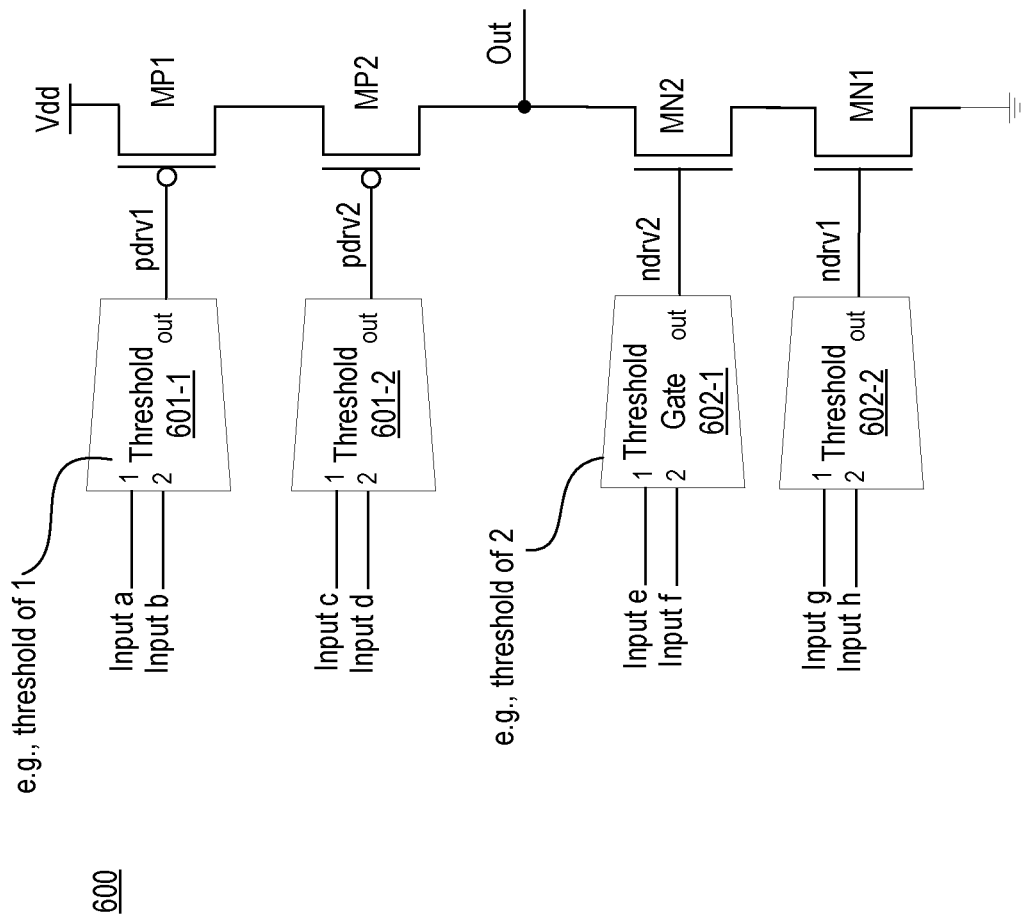
FIG. 6 illustrates an asynchronous circuit comprising a 2-input pull-up stack driven by two threshold gates, and 2-input pull-down stack driven by two threshold gates, in accordance with some embodiments.

FIG. 6 illustrates asynchronous circuit 600 comprising a 2-input pull-up stack driven by two threshold gates, and 2-input pull-down stack driven by two threshold gates, in accordance with some embodiments. In some embodiments, instead of reducing the number of devices per stack of circuit 100 (e.g., per pull-up network 101 and pull-down network 102) from four transistors to one transistor, pull-up network 101 and pull-down network 102 have two devices each. For example, pull-up network 101 includes p-type devices MP1 and MP2, while pull-down network 102 includes n-type devices MN1 and MN2 coupled as shown.

In some embodiments, 2-input threshold gate 601-1 drives pdrv1 to gate of transistor MP1 according to logic levels of input 'a' and input 'b'. In various embodiments, 2-input threshold gate 601-1 is configured to have a threshold of 1. This means when any of the inputs 'a' or 'b' is logic 1, pdrv1 is a logic 1, which keeps transistor MP1 off. As such, transistor MP1 turns on when both inputs 'a' and 'b' are logic 0. A threshold of 1 configures 2-input threshold gate 601-1 to a 2-input OR gate, in accordance with various embodiments.

In some embodiments, 2-input threshold gate 601-2 drives pdrv2 to gate of MP2 according to logic levels of input 'c' and input 'd'. In various embodiments, 2-input threshold gate 601-2 is configured to have a threshold of 1. This means when any of the inputs 'c' or 'd' is logic 1, pdrv2 is a logic 1, which keeps MP2 off. As such, MP2 turns on when both inputs 'c' and 'd' are logic 0. A threshold of 1 configures 2-input threshold gate 601-2 to a 2-input OR gate.

In some embodiments, 2-input threshold gate 602-1 drives ndrv2 to gate of MP1 according to logic levels of input 'e' and input 'f'. In various embodiments, 2-input threshold gate 602-1 is configured to have a threshold of 2. This means when any of the inputs 'e' or 'f' is logic 0, ndrv2 is a logic 0, which keeps MN2 off. As such, MN2 turns on when both inputs 'e' and 'f' are logic 1. A threshold of 2 configures 2-input threshold gate 602-1 to a 2-input AND gate.

In some embodiments, 2-input threshold gate 602-2 drives ndrv1 to gate of MN1 according to logic levels of input 'g' and input 'h'. In various embodiments, 2-input threshold gate 601-1 is configured to have a threshold of 2. This means when any of the inputs 'g' or 'h' is logic 0, ndrv1 is a logic 0, which keeps MN1 off. As such, MN1 turns on when both inputs 'e' and 'f' are logic 1. A threshold of 2 configures 2-input threshold gate 602-2 to a 2-input AND gate.

In some embodiments, a memory element is connected or coupled to the output node out. In some embodiments, the memory element is like the memory element of FIG. 3B and FIG. 4B. For example, the memory element comprises cross-coupled inverters 321 and 322 that are connected or coupled in a ring formation.

In various embodiments, a 1-input threshold gate (or 1-input capacitive circuit) is connected or coupled to the output node "out". In some embodiments, the 1-input threshold gate is independent of a feedback loop and is configured to store the state of logic on node "out2" for a period. In some embodiments, the 1-input threshold gate is 1-input capacitive circuit whose threshold is programmed to 1 as discussed with reference to FIG. 3C.

Figure 7:
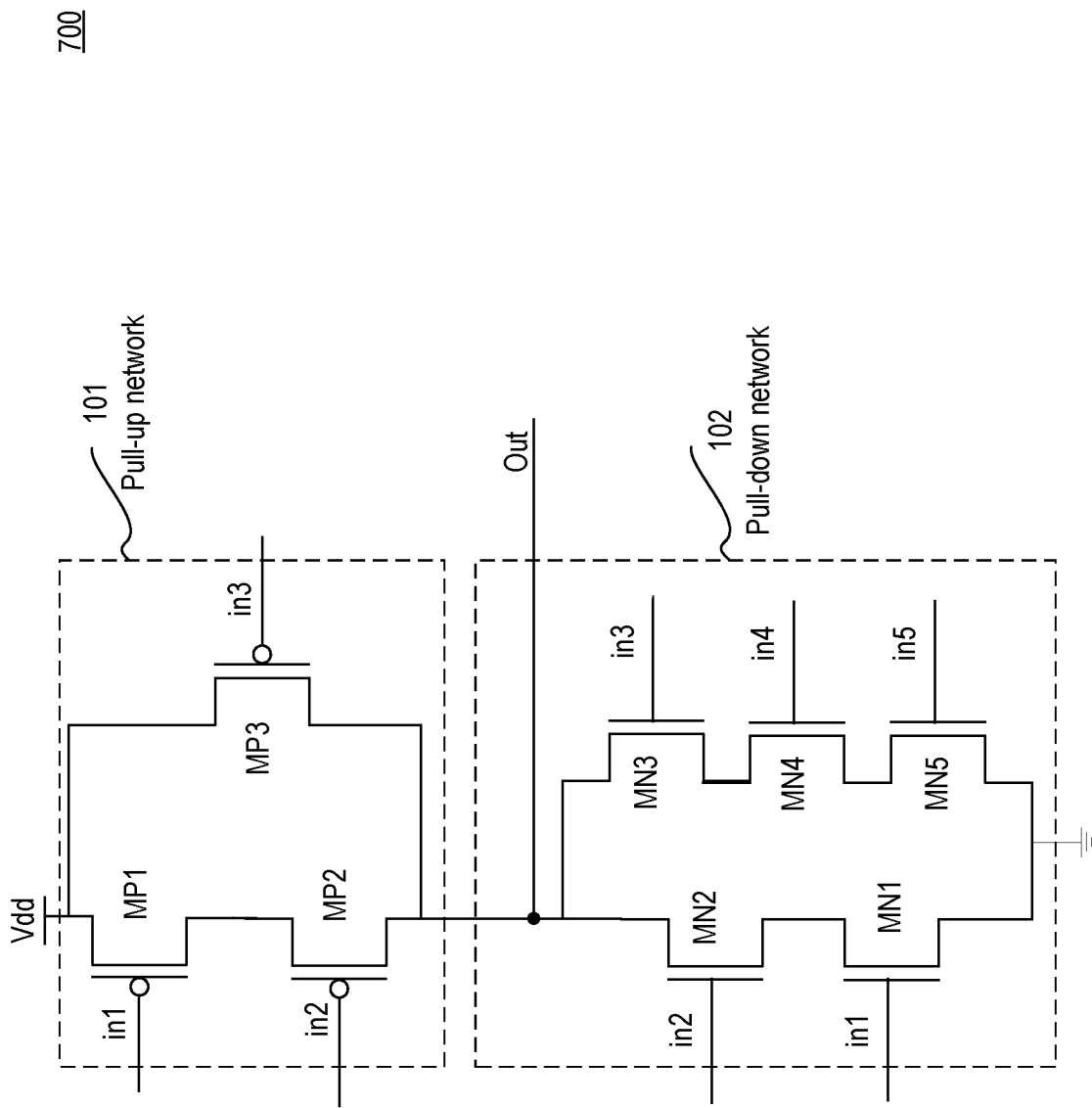
FIG. 7 illustrates an asynchronous circuit comprising a pull-up network with a parallel circuit, and a pull-down network with a parallel circuit.

FIG. 7 illustrates asynchronous circuit 700 comprising a pull-up network with a parallel circuit, and a pull-down network with a parallel circuit. Pull-up network 101 here comprises two stacked p-type devices MP1 and MP2 which together are parallel to p-type transistor MP3. The source terminal of MP1 and the source terminal of MP3 is connected to Vdd supply rail. The drain terminal of MP2 and the drain terminal of MP3 is connected to node "out". Transistor MP1 is controllable by input in1. Transistor MP2 is controllable by input in2. Transistor MP3 is controllable by input in3. Pull-down network 102 here comprises two stacked p-type devices MN1 and MN2 which together are parallel to a stack of p-type transistors MN3, MN4, and MN5. The source terminal of MN1 and the source terminal of MN5 is connected to ground Vss. The drain terminal of MN2 and the drain terminal of MN3 is connected to node "out". Transistor MN1 is controllable by input in1. Transistor MN2 is controllable by input in2. Transistor MN3 is controllable by input in3. Transistor MN4 is controllable by input in4. Transistor MN5 is controllable by input in5.

Figure 8:
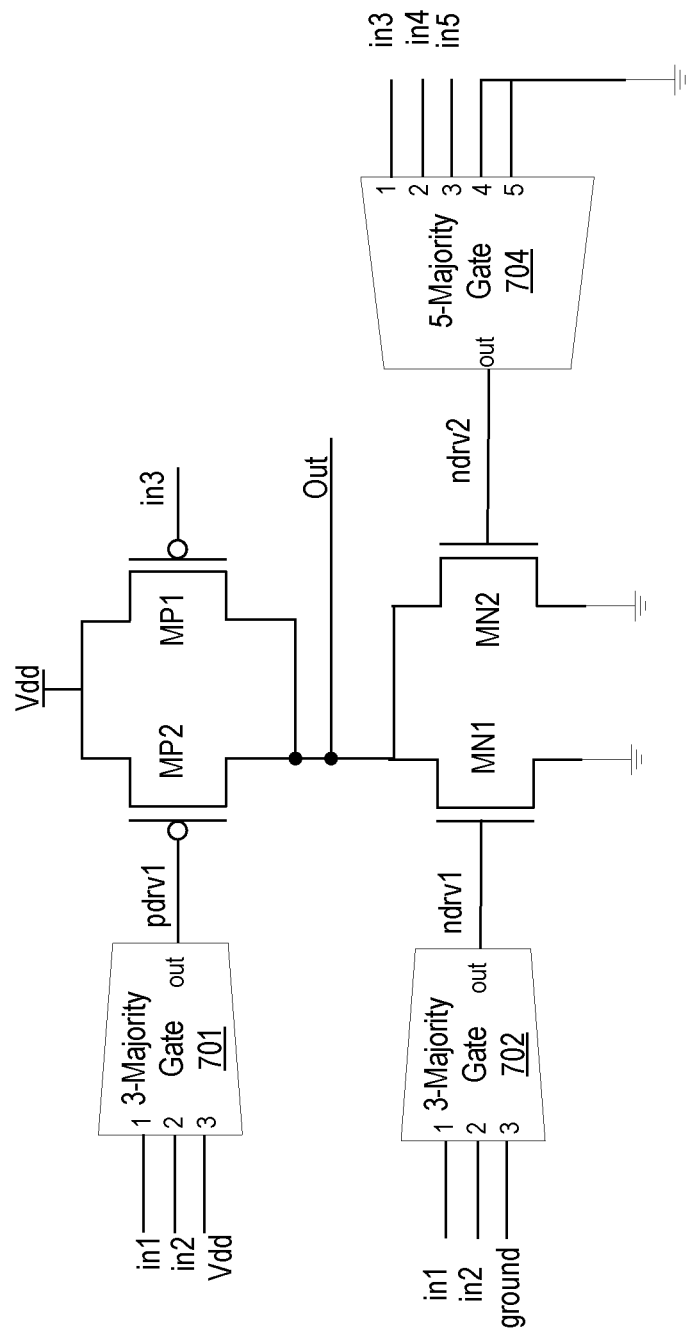
FIG. 8 illustrates an asynchronous circuit comprising a pull-up network with a parallel circuit driven by a majority gate, and a pull-down network with a parallel circuit driven by multiple majority gates, in accordance with some embodiments.

FIG. 8 illustrates asynchronous circuit 800 comprising a pull-up network with a parallel circuit driven by a majority gate, and a pull-down network with a parallel circuit driven by multiple majority gates, in accordance with some embodiments. Asynchronous circuit 800 is an equivalent circuit of asynchronous circuit 700 that can operate at lower power supply level and produce higher throughput. In some embodiments, the pull-up network of asynchronous circuit 800 comprises p-type transistor MP1 which has a gate terminal controlled by input in3, and a p-type transistor MP2 which has a gate terminal controlled by pdrv1. In various embodiments, transistors MP1 and MP2 are parallel and connected to supply rail Vdd and output node "out". In some embodiments, pdrv1 is driven by 3-input majority gate 701 which performs an OR function on inputs in1 and in2. 3-input majority gate 701 receives three inputs, in1, in2, and Vdd and performs a majority function on a summing node. An example of a 3-input majority gate is illustrated with reference to FIGS. 11-13.

In some embodiments, the pull-down network of asynchronous circuit 800 comprises n-type transistor MN1 which has a gate terminal controlled by input ndrv1, and a n-type transistor MN2 which has a gate terminal controlled by ndrv2. In some embodiments, transistor MN1 is driven by ndrv1 while transistor MN2 is driven by ndrv2. In some embodiments, ndrv1 is driven by 3-input majority gate 702 which performs an AND function on inputs in1 and in2. 3-input majority gate 702 receives three inputs, in1, in2, and ground and performs a majority function on a summing node 3-input majority gate 702. The result of the majority function then drives the gate of transistor MN1. In some embodiments, ndrv2 is driven by 5-input majority gate 704 which performs an AND function on inputs in3, in4, and in5. 5-input majority gate 704 receives five inputs, in3, in4, and in5, and two ground inputs and performs a majority function on a summing node. The result of the majority function by 5-input majority gate 704 then drives the gate of transistor MN2.

In some embodiments, a memory element is connected or coupled to the output node out. In some embodiments, the memory element is like the memory element of FIG. 3B and FIG. 4B. For example, the memory element comprises cross-coupled inverters 321 and 322 that are connected or coupled in a ring formation.

Figure 9:
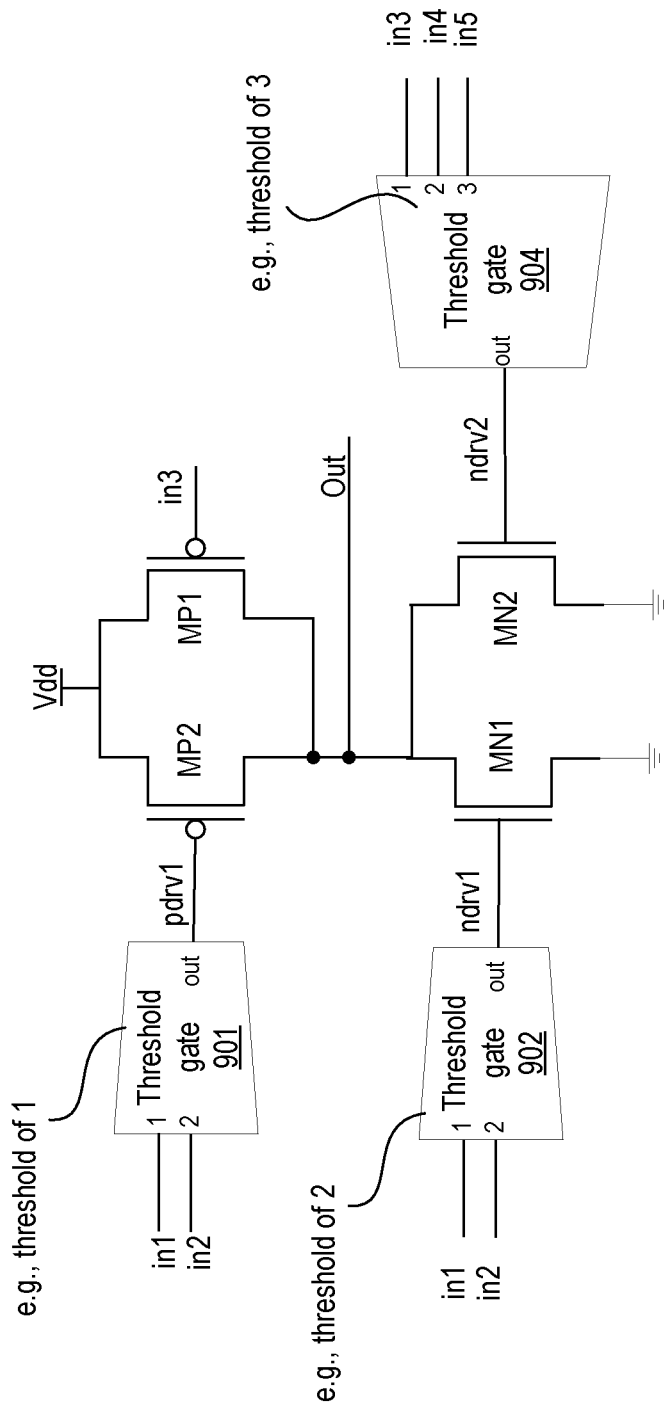
FIG. 9 illustrates an asynchronous circuit comprising a pull-up network with a parallel circuit driven by a threshold gate, and a pull-down network with a parallel circuit driven by multiple threshold gates, in accordance with some embodiments.

FIG. 9 illustrates asynchronous circuit 900 comprising a pull-up network with a parallel circuit driven by a threshold gate, and a pull-down network with a parallel circuit driven by multiple threshold gates, in accordance with some embodiments. Asynchronous circuit 900 is an equivalent circuit of asynchronous circuit 700 that can operate at lower power supply level and produce higher throughput. In some embodiments, the pull-up network of asynchronous circuit 900 comprises p-type transistor MP1 which has a gate terminal controlled by input in3, and a p-type transistor MP2 which has a gate terminal controlled by pdrv1. In various embodiments, transistors MP1 and MP2 are parallel and connected to supply rail Vdd and output node "out". In some embodiments, pdrv1 is driven by 2-input threshold gate 901 with a threshold of 1 and which performs an OR function on inputs in1 and in2.

In some embodiments, the pull-down network of asynchronous circuit 900 comprises n-type transistor MN1 which has a gate terminal controlled by input ndrv1, and a n-type transistor MN2 which has a gate terminal controlled by ndrv2. In some embodiments, transistor MN1 is driven by ndrv1 while transistor MN2 is driven by ndrv2. In some embodiments, ndrv1 is driven by 2-input threshold gate 902 with a threshold of 2 which performs an AND function on inputs in1 and in2. In some embodiments, ndrv2 is driven by 3-input threshold gate 904 with a threshold of 3 which performs an AND function on inputs in3, in4, and in5.

In some embodiments, a memory element is connected or coupled to the output node out. In some embodiments, the memory element is like the memory element of FIG. 3B and FIG. 4B. For example, the memory element comprises cross-coupled inverters 321 and 322 that are connected or coupled in a ring formation.

Figure 10:
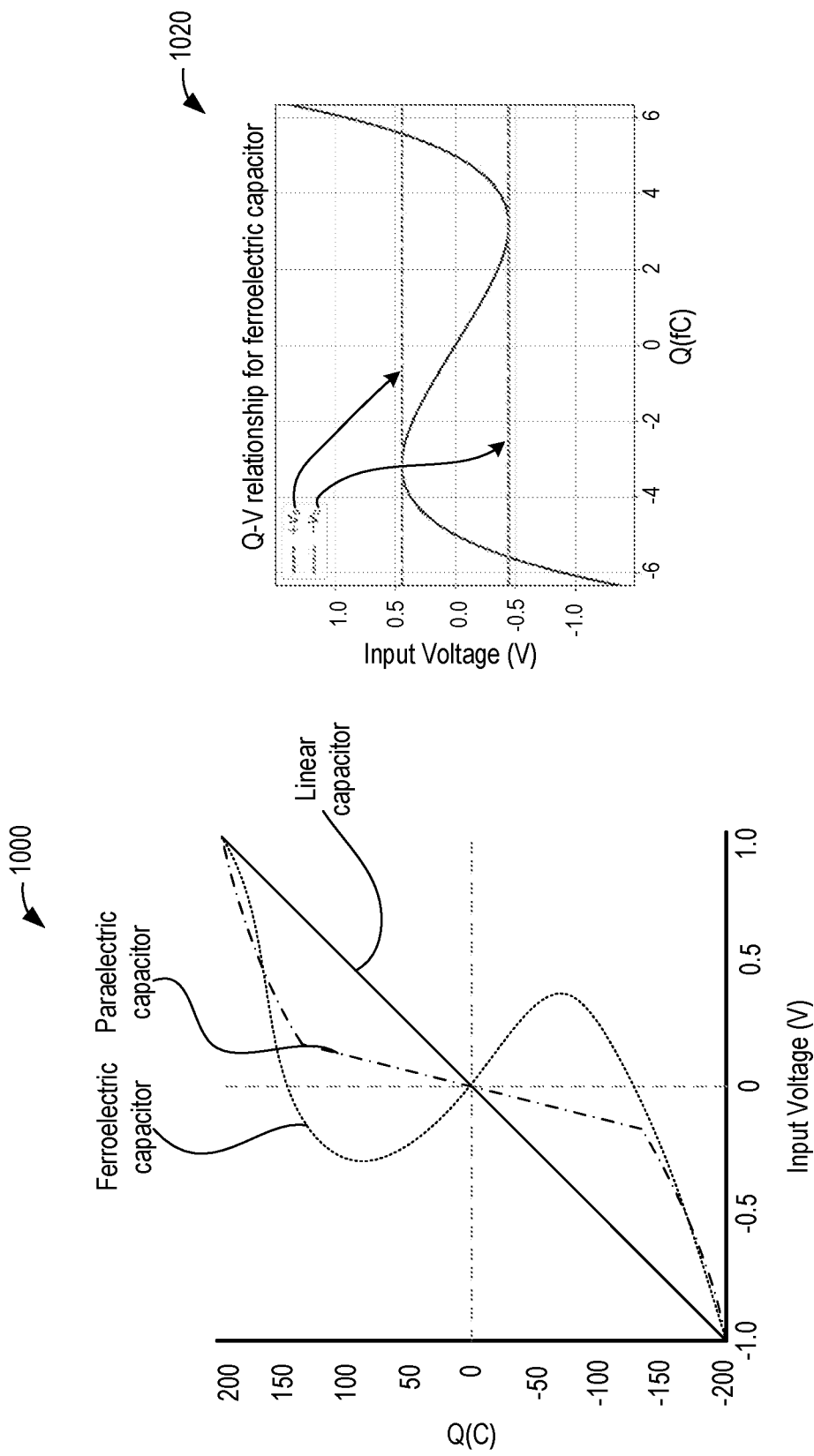
FIG. 10 illustrates a set of plots and showing behavior of a ferroelectric capacitor, a paraelectric capacitor, and a linear capacitor.

FIG. 10 illustrates a set of plots and showing behavior of a ferroelectric capacitor, a paraelectric capacitor, and a linear capacitor. Plot 1000 compares the transfer function for a linear capacitor, a ferroelectric (PE) capacitor (a non-linear capacitor) and a ferroelectric (FE) capacitor (a non-linear capacitor). Here, x-axis is input voltage or voltage across the capacitor, while the y-axis is the charge on the capacitor.

In some embodiments, linear dielectrics include one of: $SiO_2$, $Al_2O_3$, $Li_2O$, $HfSiO_4$, $Sc_2O_3$, $SrO$, $HfO_2$, $ZrO_2$, $Y_2O_3$, $Ta_2O_5$, $BaO$, $WO_3$, $MoO_3$, or $TiO_2$. In some embodiments, the paraelectric dielectric material include one of: Ba, Sr, Ti, Hf, Zr, Si, La, Pb, Mg, or Nb. In some embodiments, the paraelectric material includes one of: $SrTiO_3$, $Ba(x)Sr(y)TiO_3$ (where x is −0.5, and y is 0.95), $HfZrO_2$, $BaTiO_3$, Hf—Si—O, La-substituted $PbTiO_3$, or PMN-PT (lead magnesium niobate-lead titanate) based relaxor ferroelectrics.

In some embodiments, the ferroelectric material can be any suitable low voltage FE material that allows the FE material to switch its state by a low voltage (e.g., 100 mV). Threshold in the FE material has a highly non-linear transfer function in the polarization vs. voltage response. The threshold is related to a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization, perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 1020 shows the charge and voltage relationship for a ferroelectric capacitor. A capacitor with ferroelectric material (also referred to as a FEC) is a non-linear capacitor with its potential $V_F(Q_F)$ as a cubic function of its charge. Plot 1020 illustrates characteristics of an FEC. Plot 1020 is a charge-voltage (Q-V) plot for a block of $Pb(Zr_{0.5}Ti_{0.5})O_3$ of area $(100\ nm)^2$ and thickness 30 nm (nanometer). Plot 1020 shows local extrema at $+/-V_o$ indicated by the dashed lines. Here, the term Vc is the coercive voltage. In applying a potential V across the FEC, its charge can be unambiguously determined only for $|V|>V_o$. Otherwise, the charge of the FEC is subject to hysteresis effects.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, $BaTiO_3$, $KNbO_3$, $NaTaO_3$, etc. may be used for FE material. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted BiFeO3, BrCrO3, BuCoO3 class of materials, La or rare earth substitution into the Bi site can tune the spontaneous distortion. In some embodiments, FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A, it can be an element from the Lanthanides series. B' is a dopant for atomic site B, it can be an element from the transition metal elements, especially Sc, Ti, V, Cr, Mn, Fe, Co, Ni, Cu, Zn. A' may have the same valency of site A, with a different ferroelectric polarizability. In various embodiments, when metallic perovskite is used for the FE material, conductive oxides can include one or more of: $IrO_2$, $RuO_2$, $PdO_2$, $OSO_2$, or $ReO_3$. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05 or 0.5, and y is 0.95), HfZrO2, Hf—Si—O, La-substituted PbTiO3, PMN-PT based relaxor ferroelectrics.

In some embodiments, the FE material comprises one or more of: Hafnium (Hf), Zirconium (Zr), Aluminum (Al), Silicon (Si), their oxides or their alloyed oxides. In some embodiments, FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, the FE material includes Bismuth ferrite (BFO) with a doping material where in the doping material is one of Lanthanum, or any element from the lanthanide series of the periodic table. In some embodiments, FE material includes lead zirconium titanate (PZT), or PZT with a doping material, wherein the doping material is one of La, Nb. In some embodiments, FE material includes a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, the FE material includes Hafnium oxides of the form, Hf1-x Ex Oy where E can be Al, Ca, Ce, Dy, er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are 'n' octahedral layers in thickness can be used. In some embodiments, the FE material comprises organic material. For example, Polyvinylidene fluoride or polyvinylidene difluoride (PVDF).

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100.

Figure 11:
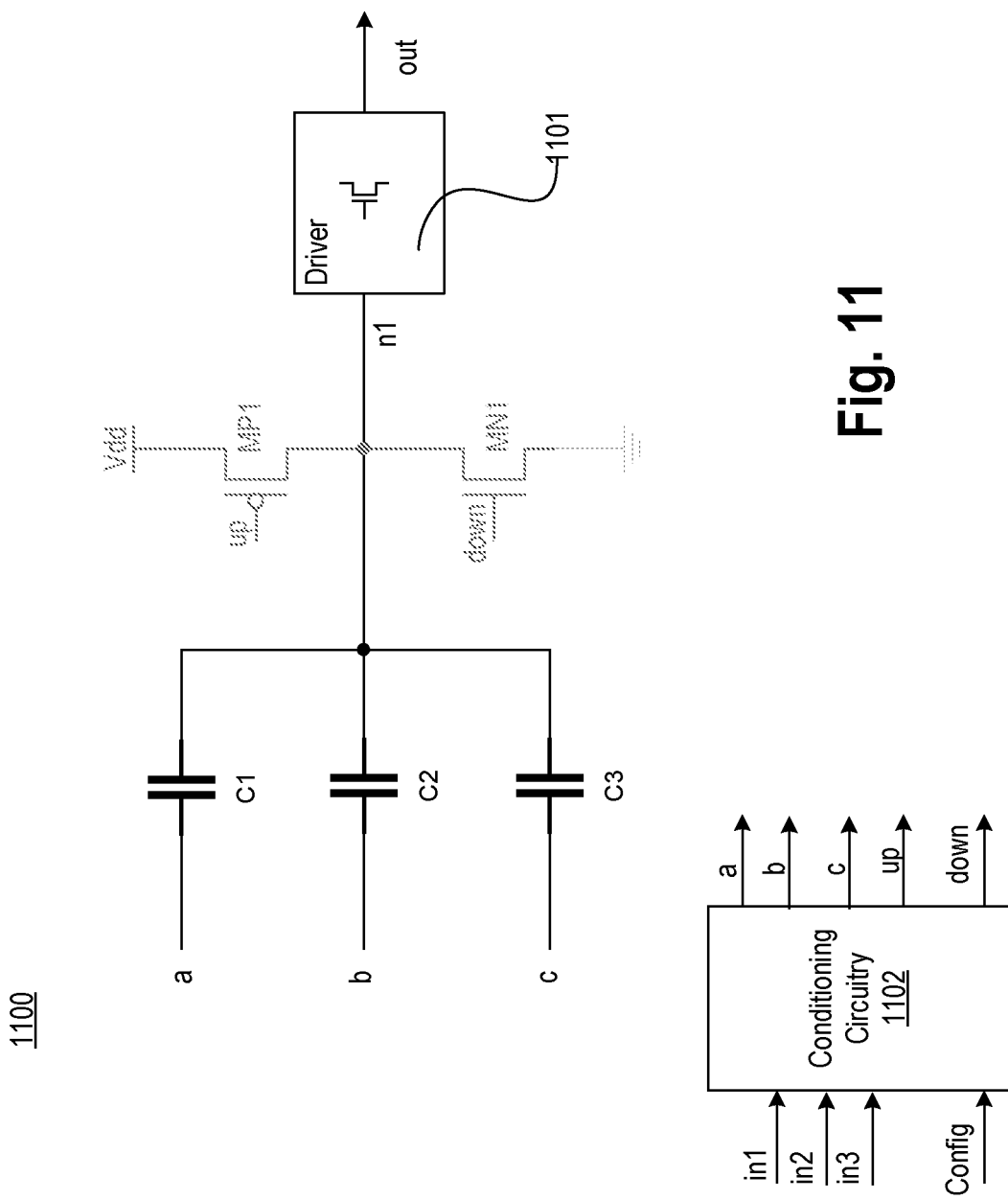
FIG. 11 illustrates a 3-input capacitive circuit with linear capacitors, where the 3-input capacitive circuit has a configurable or programmable threshold, in accordance with some embodiments.

FIG. 11 illustrates 3-input capacitive circuit 1100 with linear capacitors (e.g., capacitors with linear dielectric), where the 3-input capacitive circuit has a configurable or programmable threshold, in accordance with some embodiments. 3-input capacitive circuit 1100 includes a first input 'a' coupled to linear capacitor C1, a second input 'b' coupled to linear capacitor C2, and a third input 'c' coupled to linear capacitor C3. In some embodiments, a first terminal of capacitor C1 is coupled to input 'a' while a second terminal of capacitor C1 is coupled to summing node n1. In some embodiments, a first terminal of capacitor C2 is coupled to input 'b' while a second terminal of capacitor C2 is coupled to summing node n1. In some embodiments, a first terminal of capacitor C3 is coupled to input 'c' while a second terminal of capacitor C3 is coupled to summing node n1.

Conditioning circuitry 1102 may receive inputs in1, in2, and in3 and configuration setting (e.g., reset or evaluation) to determine the outputs 'a', 'b', 'c', up, and down. During the evaluation phase, in1 is passed on to output 'a', in2 is passed on to 'b', and in3 is passed on to 'c'. During the reset phase, depending on a desired threshold, outputs 'a', 'b', and 'c' are conditioned.

In some embodiments, by turning on/off one or more of the pull-up device MP1 and/or pull-down device MN1, and conditioning the inputs 'a', 'b', and 'c' during a reset phase, the charge at node n1 is set so that in an evaluation phase when the pull-up and pull-down devices (MP1 and MN1) are disabled, 3-input capacitive circuit 1100 attains a desired function. The devices MP1 and MN1 here are not the same devices of pull-up network and the pull-down network coupled to node out.

In one instance, when the threshold is set to 2 in a reset phase by a particular sequencing of turning on/off the pull-up and/or the pull-down devices and conditioning of the inputs 'a', 'b', and 'c'; it means that during an evaluation phase when at least two of the three inputs 'a', 'b', and 'c' are logic high, then voltage on node n1 is logic high. Continuing with this example, when at least two inputs of the three inputs 'a' 'b', and 'c' is a logic low, then the voltage on node n1 resolves to logic low. As such, 3-input capacitive circuit 1100 is programmed or configured as a majority gate at node n1 and a minority gate at output out (when the driver circuitry 1101 is an inverter). In some cases, depending upon the leakage balance of pull-up transistor MP1 and pull-down MN1 as it impacts charge on the summing node n1, 3-input capacitive circuit 1100 may lose its majority logic functionality over time. This loss in functionality of the majority function can be restored by resetting the summing node n1 via transistors MP1 and MN1, in accordance with some embodiments.

In some embodiments, when the threshold is set to 3 in a reset phase by a particular sequencing of turning on/off the pull-up and/or the pull-down devices and conditioning of the inputs 'a', 'b', and 'c'; it means that during an evaluation phase when all three inputs 'a', 'b', and 'c' are logic high, then voltage on node n1 is logic high. Continuing with this example, when any of the three inputs 'a' 'b', and 'c' is a logic low, then the voltage on node n1 resolves to logic low. As such, 3-input capacitive circuit 1100 is programmed or configured as a 3-input AND at node n1 and a 3-input NAND gate at output out (assuming the driver circuitry is an inverter).

In some embodiments, when the threshold is set to 1 in a reset phase by a particular sequencing of turning on/off the pull-up and/or the pull-down devices and conditioning of the inputs 'a' and 'b; it means that during an evaluation phase when any of the inputs 'a' 'b', or 'c' is logic high, then voltage on node n1 is logic high. Continuing with this example, when all inputs 'a', 'b', or 'c' is a logic low, then the voltage on node n1 resolves to logic low. As such, 3-input capacitive circuit 1100 is programmed or configured as an OR gate at node n1 and a NOR gate at output out.

So, the same circuit can be used as a majority/minority gate, AND/NAND or OR/NOR gate by conditioning the inputs and resetting or setting the voltage on the summing node during a reset phase. Subsequently, in the evaluation phase the circuit will behave as a 3-input majority/minority, 3-input AND/NAND or 3-input OR/NOR gate.

In some embodiments, conditioning circuitry 1102 sets the threshold to 0 in a reset phase by disabling or turning off the pull-down device MN1, turning on or enabling the pull-up device MP1, and providing logic 1 to the first input 'a', logic 0 to the second input 'b', and logic 0 to the third input 'c'. In some embodiments, conditioning circuitry 1102 sets the threshold to 0 in a reset phase by disabling or turning off the pull-down device MN1, turning on or enabling the pull-up device MP1, and providing logic 0 to all inputs 'a', 'b', and 'c'. A threshold of 0 means that the capacitive-input circuit is an always on circuit regardless of the logic levels of inputs. In one such embodiment, during the evaluation phase for the circuit configured with threshold of zero, the logic value on node n1 is logic 1, and the logic value on output out is logic 0 (assuming the driver 1101 is an inverter).

In some embodiments, conditioning circuitry 1102 (or any other conditioning circuit) sets the threshold to 4. A threshold of 4 for a 3-input capacitive circuit means that capacitive input circuit is an always off circuit regardless of the logic levels of the inputs. In one such embodiment, during the evaluation phase for the circuit configured with threshold of n+1 (e.g., 4, where 'n' is the number of capacitive inputs), the logic value on node n1 is floating and may eventually discharge to ground or charge to supply level. In some embodiments, the voltage on node n1 is zero volts regarding of input setting when the threshold in 4 (e.g., n+1).

Table 6 illustrates an example of input conditioning to set various thresholds during a reset phase for 3-input capacitive circuit 1100. Table 6 illustrates the case where both pull-up and pull-down devices are used, but as discussed herein some embodiments use a pull-up device or a pull-down device for setting or resetting the summing node.

TABLE 6

| 'a' | 'b' | 'c' | First control (Up) | Second control (down) | Threshold |
|---|---|---|---|---|---|
| 0 | 0 | 0 | 1 (disable MP1) | 1 (enable MN1) | 2 |
| 1 | 0 | 0 | 1 (disable MP1) | 1 (enable MN1) | 3 |
| 1 | 1 | 0 | 1 (disable MP1) | 1 (enable MN1) | 3 |
| 1 | 1 | 1 | 1 (disable MP1) | 1 (enable MN1) | 3 |

TABLE 6-continued

| 'a' | 'b' | 'c' | First control (Up) | Second control (down) | Threshold |
|---|---|---|---|---|---|
| 0 | 0 | 0 | 0 (enable MP1) | 0 (disable MN1) | 0 |
| 1 | 0 | 0 | 0 (enable MP1) | 0 (disable MN1) | 0 |
| 1 | 1 | 0 | 0 (enable MP1) | 0 (disable MN1) | 1 |
| 1 | 1 | 1 | 0 (enable MP1) | 0 (disable MN1) | 2 |

As discussed herein, if one of the pull-up device MP1 or pull-down device MN1 is not present, then the control for the existing device on node n1 (e.g., pull-up device MP1 or pull-down device MN1) is applied to configure the threshold. While the embodiments are illustrated with reference to same capacitances for first capacitor C1, the second capacitor C2, and the third capacitor C3, the threshold can be affected by changing the capacitive ratio of C1, C2, and C3 relative to one another. For example, the input conditioning scheme and the pull-up and pull-down device control can result in a different threshold than that in Table 6 when the capacitive ratio of C1, C2, and C3 is not 1:1:1. Overall, the configuring scheme of various embodiments herein provide the flexibility of programming the threshold for 3-input capacitive circuit 1100 in a reset phase to achieve a certain logic function in the evaluation phase.

Table 7 illustrates a logic function achieved in the evaluation phase by configuring the threshold in the reset phase for 3-input capacitive circuit 1100. In various embodiments, the pull-up device MP1 and the pull-down device MN1 are disabled during the evaluation phase.

TABLE 7

| Threshold | Logic Function on node n1 | Logic function on node "out" |
|---|---|---|
| 0 | Logic 1 | Logic 0 |
| 1 | OR | NOR |
| 2 | Majority | Minority |
| 3 | AND | NAND |

Figure 12:
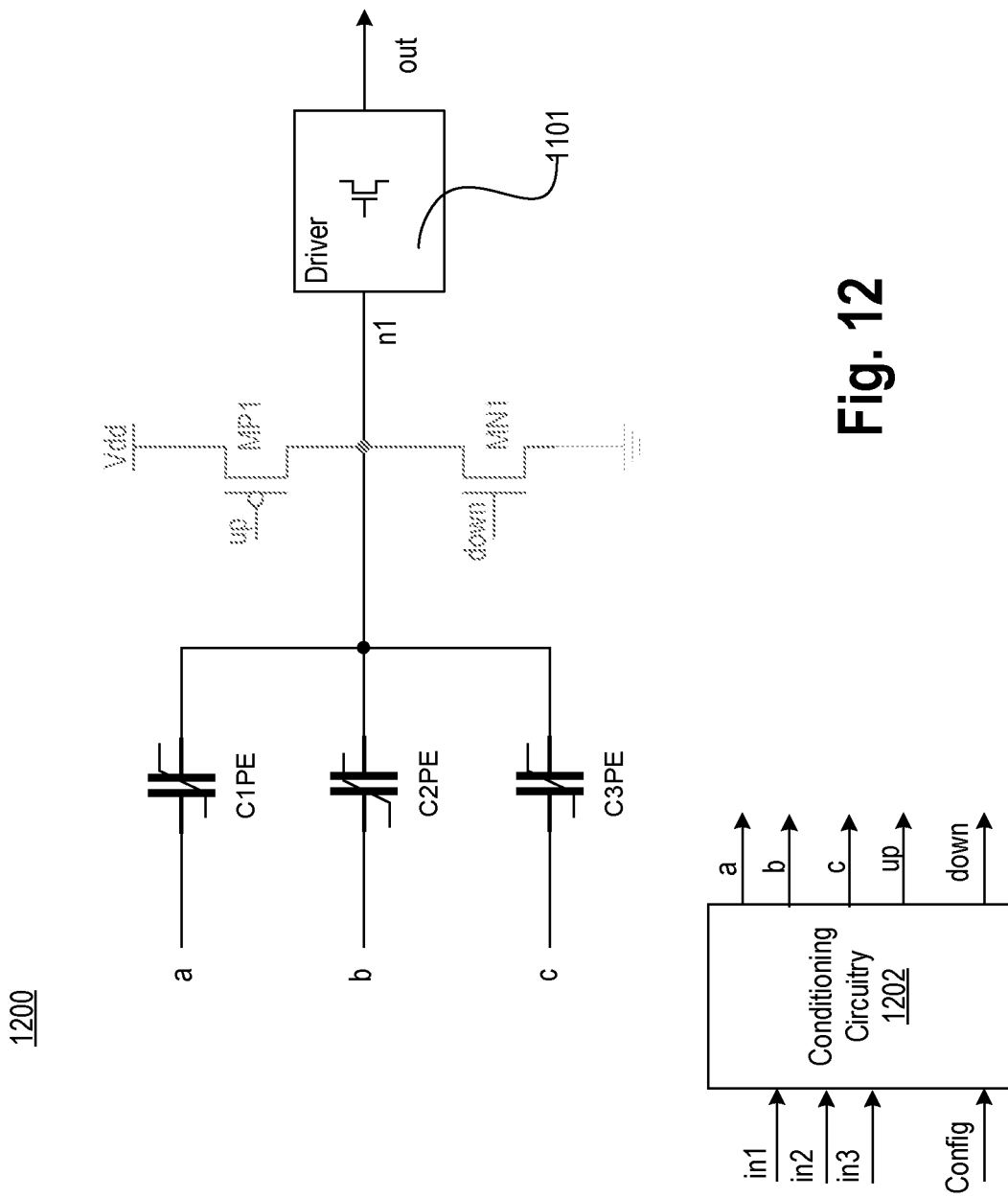
FIG. 12 illustrates a 3-input capacitive circuit with paraelectric capacitors, where the 3-input capacitive circuit has a configurable or programmable threshold, in accordance with some embodiments.

FIG. 12 illustrates 3-input capacitive circuit 1200 with paraelectric capacitors (with paraelectric dielectric), where the 3-input capacitive circuit has a configurable or programmable threshold, in accordance with some embodiments. 3-input capacitive circuit 1200 includes a first input 'a' coupled to paraelectric capacitor C1PE, a second input 'b' coupled to paraelectric capacitor C2PE, and a third input 'c' coupled to paraelectric capacitor C3PE. In some embodiments, a first terminal of capacitor C1PE is coupled to input 'a' while a second terminal of paraelectric capacitor C1PE is coupled to a summing node n1. In some embodiments, a first terminal of capacitor C2PE is coupled to input 'b' while a second terminal of capacitor C2PE is coupled to the summing node n1. In some embodiments, a first terminal of capacitor C3PE is coupled to input 'c' while a second terminal of capacitor C3PE is coupled to the summing node n1.

Conditioning circuitry 1202 may receive inputs in1, in2, and in3 and configuration setting (e.g., reset or evaluation) to determine the outputs 'a', 'b', 'c', up, and down. During the evaluation phase, in1 is passed on to output 'a', in2 is passed on to 'b', and in3 is passed on to 'c'. During the reset phase, depending on a desired threshold, outputs 'a', 'b', and 'c' are conditioned.

In some embodiments, by turning on/off one or more of the pull-up device MP1 and/or pull-down device MN1, and conditioning the inputs 'a', 'b', and 'c' during a reset phase, the charge at node n1 is set so that in an evaluation phase when the pull-up and pull-down devices (MP1 and MN1) are disabled, 3-input capacitive circuit 1200 attains a desired function. The devices MP1 and MN1 here are not the same devices of pull-up network and the pull-down network coupled to node out.

Table 8 illustrates an example of input conditioning to set various thresholds during a reset phase for 3-input capacitive circuit 1200. Table 8 illustrates the case where both pull-up and pull-down devices are used, but as discussed herein some embodiments use a pull-up device or a pull-down device, but not both, for setting or resetting the summing node.

TABLE 8

| 'a' | 'b' | 'c' | First control (Up) | Second control (down) | Threshold |
|---|---|---|---|---|---|
| 0 | 0 | 0 | 1 (disable MP1) | 1 (enable MN1) | 2 |
| 1 | 0 | 0 | 1 (disable MP1) | 1 (enable MN1) | 3 |
| 1 | 1 | 0 | 1 (disable MP1) | 1 (enable MN1) | 3 |
| 1 | 1 | 1 | 1 (disable MP1) | 1 (enable MN1) | 4 |
| 0 | 0 | 0 | 0 (enable MP1) | 0 (disable MN1) | 0 |
| 1 | 0 | 0 | 0 (enable MP1) | 0 (disable MN1) | 1 |
| 1 | 1 | 0 | 0 (enable MP1) | 0 (disable MN1) | 1 |
| 1 | 1 | 1 | 0 (enable MP1) | 0 (disable MN1) | 2 |

As discussed herein, if one of the pull-up device MP1 or pull-down device MN1 is not present, then the control for the existing device on node n1 (e.g., pull-up device MP1 or pull-down device MN1) is applied to configure the threshold. While the embodiments are illustrated with reference to same capacitances for the first capacitor C1PE, the second capacitor C2PE, and the third capacitor C3PE, the threshold can be affected by changing the capacitive ratio of C1PE, C2PE, and C3PE relative to one another. For example, the input conditioning scheme and the pull-up and pull-down device control can result in a different threshold than that in Table 9 when the capacitive ratio of C1PE, C2PE, and C3PE is not 1:1:1. Overall, the configuring scheme of various embodiments herein provide the flexibility of programming or adjusting the threshold for 3-input capacitive circuit 1200 in a reset phase to achieve a certain logic function in the evaluation phase.

Table 9 illustrates a logic function achieved in the evaluation phase by configuring the threshold in the reset phase for 3-input capacitive circuit 1200. In various embodiments, the pull-up device MP1 and the pull-down device MN1 are disabled during the evaluation phase.

TABLE 9

| Threshold | Logic Function on node n1 | Logic function on node "out" |
|---|---|---|
| 0 | Logic 1 | Logic 0 |
| 1 | OR | NOR |
| 2 | Majority | Minority |
| 3 | AND | NAND |
| 4 | Logic 0 | Logic 1 |

Figure 13:
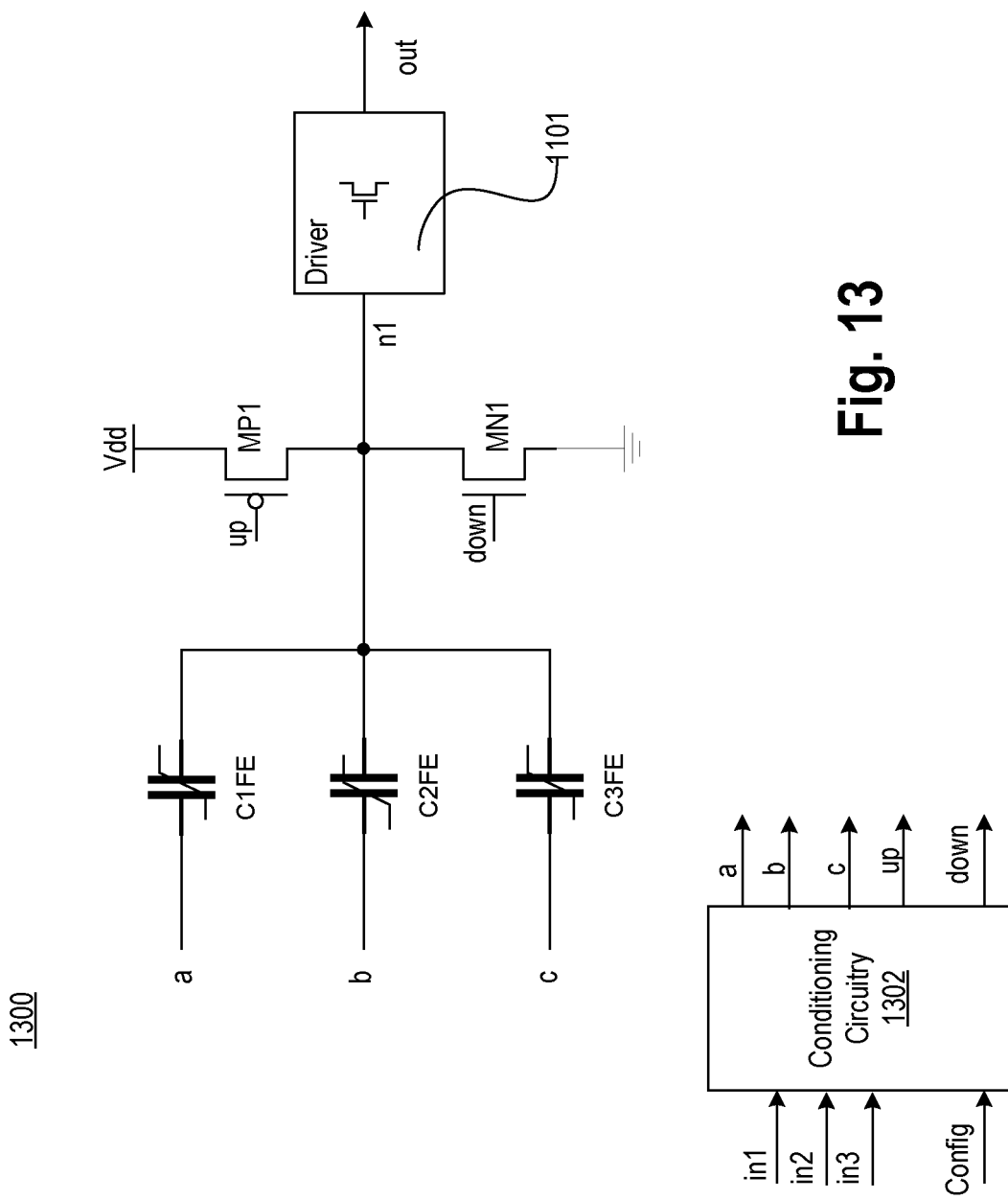
FIG. 13 illustrates a 3-input capacitive circuit with ferroelectric capacitors, where the 3-input capacitive circuit has a configurable or programmable threshold, in accordance with some embodiments.

FIG. 13 illustrates 3-input capacitive circuit 1300 with ferroelectric capacitors (e.g., capacitors with ferroelectric material), where the 3-input capacitive circuit has a configurable or programmable threshold, in accordance with some embodiments. 3-input capacitive circuit 1300 includes a first input 'a' coupled to ferroelectric capacitor C1FE, a second input 'b' coupled to ferroelectric capacitor C2FE, and a third input 'c' coupled to ferroelectric capacitor C3FE. In some embodiments, a first terminal of capacitor C1FE is coupled to input 'a' while a second terminal of capacitor C1FE is coupled to summing node n1. In some embodiments, a first terminal of capacitor C2FE is coupled to input 'a' while a second terminal of capacitor C2FE is coupled to summing node n1. In some embodiments, a first terminal of capacitor C3FE is coupled to input 'c' while a second terminal of capacitor C3FE is coupled to summing node n1.

Conditioning circuitry 1302 may receive inputs in1, in2, and in3 and configuration setting (e.g., reset or evaluation) to determine the outputs 'a', 'b', 'c', up, and down. During the evaluation phase, in1 is passed on to output 'a', in2 is passed on to 'b', and in3 is passed on to 'c'. During the reset phase, depending on a desired threshold, outputs 'a', 'b', and 'c' are conditioned.

Table 10 illustrates an example of input conditioning to set various thresholds during a reset phase for 3-input capacitive circuit 1300. In various embodiments, during the sequence one of pull-up or pull-down device is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more). The devices MP1 and MN1 here are not the same devices of pull-up network and the pull-down network coupled to node out.

TABLE 10

| 'a' | 'b' | 'c' | T1 | T2 | T3 | Threshold |
|---|---|---|---|---|---|---|
| 0 | 0 | 0 | 1 (enable MN1) | 0 (disable MN1) | 0 (enable MP1) | 0 |
| 1 | 0 | 0 | 1 (enable MN1) | 0 (disable MN1) | 0 (enable MP1) | 1 |
| 1 | 1 | 0 | 1 (enable MN1) | 0 (disable MN1) | 0 (enable MP1) | 2 |
| 1 | 1 | 1 | 1 (enable MN1) | 0 (disable MN1) | 0 (enable MP1) | 3 |
| 0 | 0 | 0 | 0 (enable MP1) | 1 (disable MP1) | 1 (enable MN1) | 1 |
| 1 | 0 | 0 | 0 (enable MP1) | 1 (disable MP1) | 1 (enable MN1) | 2 |
| 1 | 1 | 0 | 0 (enable MP1) | 1 (disable MP1) | 1 (enable MN1) | 3 |
| 1 | 1 | 1 | 0 (enable MP1) | 1 (disable MP1) | 1 (enable MN1) | 4 |

While the embodiments are illustrated with reference to same capacitances for the first capacitor C1FE, the second capacitor C2FE, and the third capacitor C3FE, the threshold can be affected by changing the capacitive ratio of C1FE, C2FE, and C3FE relative to one another. For example, the input conditioning scheme and the pull-up and pull-down device control can result in a different threshold than that in Table 10 when the capacitive ratio of C1FE, C2FE, and C3FE is not 1:1:1. Overall, the configuring scheme of various embodiments herein provide the flexibility of programming or adjusting the threshold for 3-input capacitive circuit 1300 in a reset phase to achieve a certain logic function in the evaluation phase.

Table 11 illustrates a logic function achieved in the evaluation phase by configuring the threshold in the reset phase for 3-input capacitive circuit 1300. In various embodiments, the pull-up device MP1 and the pull-down device MN1 are disabled during the evaluation phase.

TABLE 11

| Threshold | Logic Function on node n1 | Logic function on node "out" |
|---|---|---|
| 0 | Logic 1 | Logic 0 |
| 1 | OR | NOR |
| 2 | Majority | Minority |

TABLE 11-continued

| Threshold | Logic Function on node n1 | Logic function on node "out" |
|---|---|---|
| 3 | AND | NAND |
| 4 | Logic 0 | Logic 1 |

Figure 14:
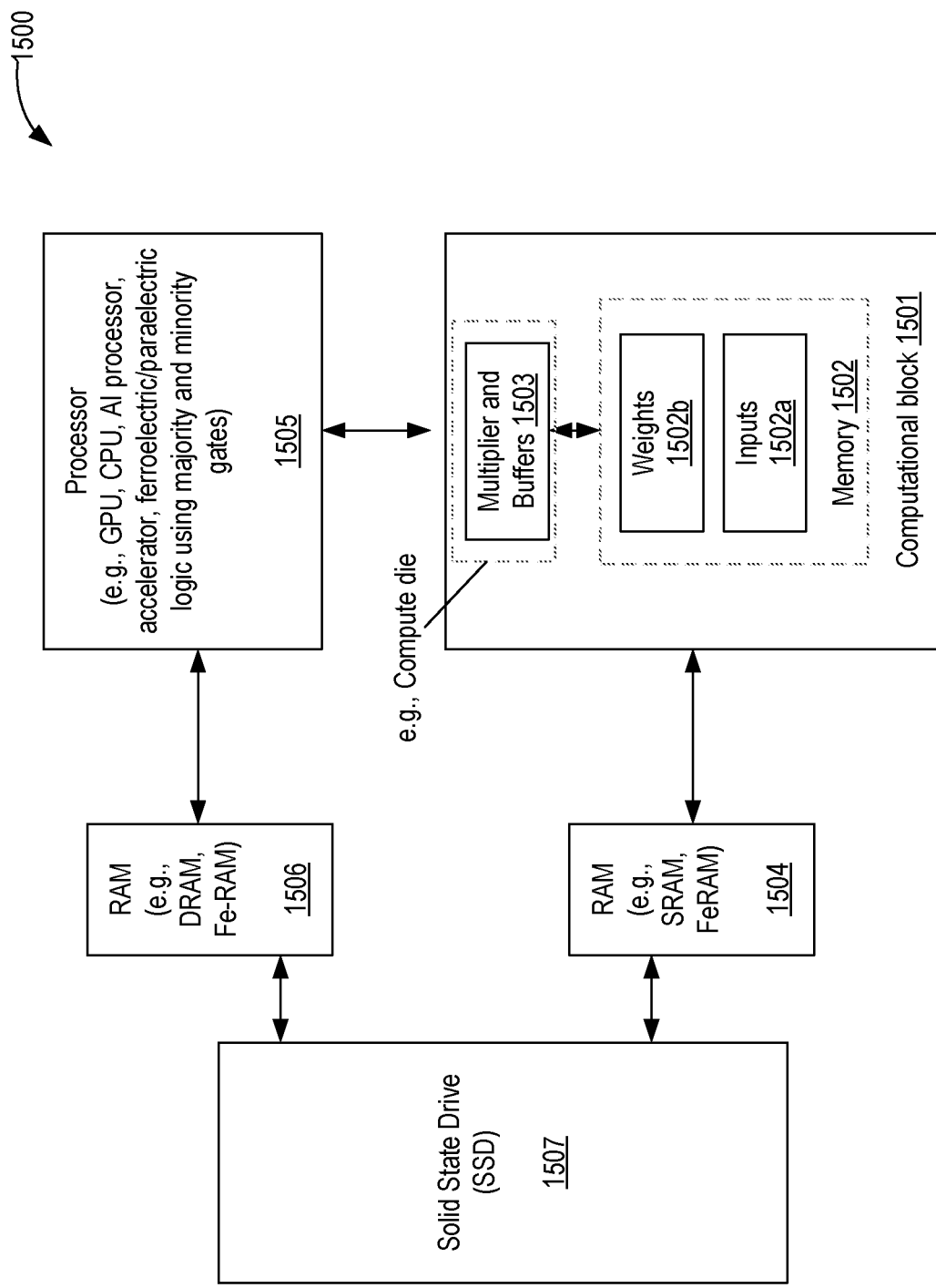
FIG. 14 illustrates a high-level architecture of an artificial intelligence (AI) machine comprising a compute die stacked with a memory die, wherein the compute die includes an asynchronous circuit, in accordance with some embodiments.

FIG. 14 illustrates a high-level architecture of an artificial intelligence (AI) machine comprising a compute die stacked with a memory die, wherein the compute die includes an asynchronous circuit, in accordance with some embodiments. AI machine 1500 comprises computational block 1501 or processor having random-access memory (RAM) 1502 and computational logic 1503; first random-access memory 1504 (e.g., static RAM (SRAM), ferroelectric or paraelectric RAM (FeRAM), ferroelectric or paraelectric static random-access memory (FeSRAM)), main processor 1505, second random-access memory 1506 (dynamic RAM (DRAM), FeRAM), and solid-state memory or drive (SSD) 1507. In some embodiments, some or all components of AI machine 1500 are packaged in a single package forming a system-on-chip (SoC). The SoC can be configured as a logic-on-logic configuration, which can be in a 3D configuration or a 2.5D configuration.

In some embodiments, computational block 1501 is packaged in a single package and then coupled to processor 1505 and memories 1504, 1506, and 1507 on a printed circuit board (PCB). In some embodiments, computational block 1501 is configured as a logic-on-logic configuration, which can be in a 3D configuration or a 2.5D configuration. In some embodiments, computational block 1501 comprises a special purpose compute die 1503 or microprocessor. For example, compute die 1503 is a compute chiplet that performs a function of an accelerator or inference. In some embodiments, memory 1502 is DRAM which forms a special memory/cache for the special purpose compute die 1503. The DRAM can be embedded DRAM (eDRAM) such as 1T1C (one transistor and one capacitor) based memories. In some embodiments, RAM 1502 is ferroelectric or paraelectric RAM (Fe-RAM).

In some embodiments, compute die 1503 is specialized for applications such as Artificial Intelligence, graph processing, and algorithms for data processing. In some embodiments, compute die 1503 further has logic computational blocks, for example, for multipliers and buffers, a special data memory block (e.g., buffers) comprising DRAM, FeRAM, or a combination of them. In some embodiments, RAM 1502 has weights and inputs stored to improve the computational efficiency. The interconnects between processor 1505 (also referred to as special purpose processor), first RAM 1504 and compute die 1503 are optimized for high bandwidth and low latency. The architecture of FIG. 14 allows efficient packaging to lower the energy, power, or cost and provides for ultra-high bandwidth between RAM 1502 and compute chiplet 1503 of computational block 1501.

In some embodiments, RAM 1502 is partitioned to store input data (or data to be processed) 1502a and weight factors 1502b. In some embodiments, input data 1502a is stored in a separate memory (e.g., a separate memory die) and weight factors 1502b are stored in a separate memory (e.g., separate memory die).

In some embodiments, computational logic or compute chiplet 1503 comprises matrix multiplier, adder, concatenation logic, buffers, and combinational logic. In various embodiments, compute chiplet 1503 performs multiplication operation on inputs 1502a and weights 1502b. In some embodiments, weights 1502*b* are fixed weights. For example, processor 1505 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 1502. In various embodiments, the input data that is to be analyzed using a trained model, is processed by computational block 1501 with computed weights 1502*b* to generate an output (e.g., a classification result).

In some embodiments, first RAM 1504 is ferroelectric or paraelectric based SRAM. For example, a six transistor (6T) SRAM bit-cells having ferroelectric or paraelectric transistors are used to implement a non-volatile FeSRAM. In some embodiments, SSD 1507 comprises NAND flash cells. In some embodiments, SSD 1507 comprises NOR flash cells. In some embodiments, SSD 1507 comprises multi-threshold NAND flash cells.

In various embodiments, the non-volatility of FeRAM is used to introduce new features such as security, functional safety, and faster reboot time of AI machine 1500. The non-volatile FeRAM is a low power RAM that provides fast access to data and weights. FeRAM 1504 can also serve as a fast storage for computational block 1501 (which can be an inference die or an accelerator), which typically has low capacity and fast access requirements.

In various embodiments, the FeRAM (FeDRAM or FeSRAM) includes ferroelectric or paraelectric material. The ferroelectric or paraelectric material may be in a transistor gate stack or in a capacitor of the memory. The ferroelectric material can be any suitable low voltage FE material discussed with reference to various embodiments. While embodiments here are described with reference to ferroelectric material, the embodiments are applicable to any of the non-linear polar materials described herein.

Figure 15:
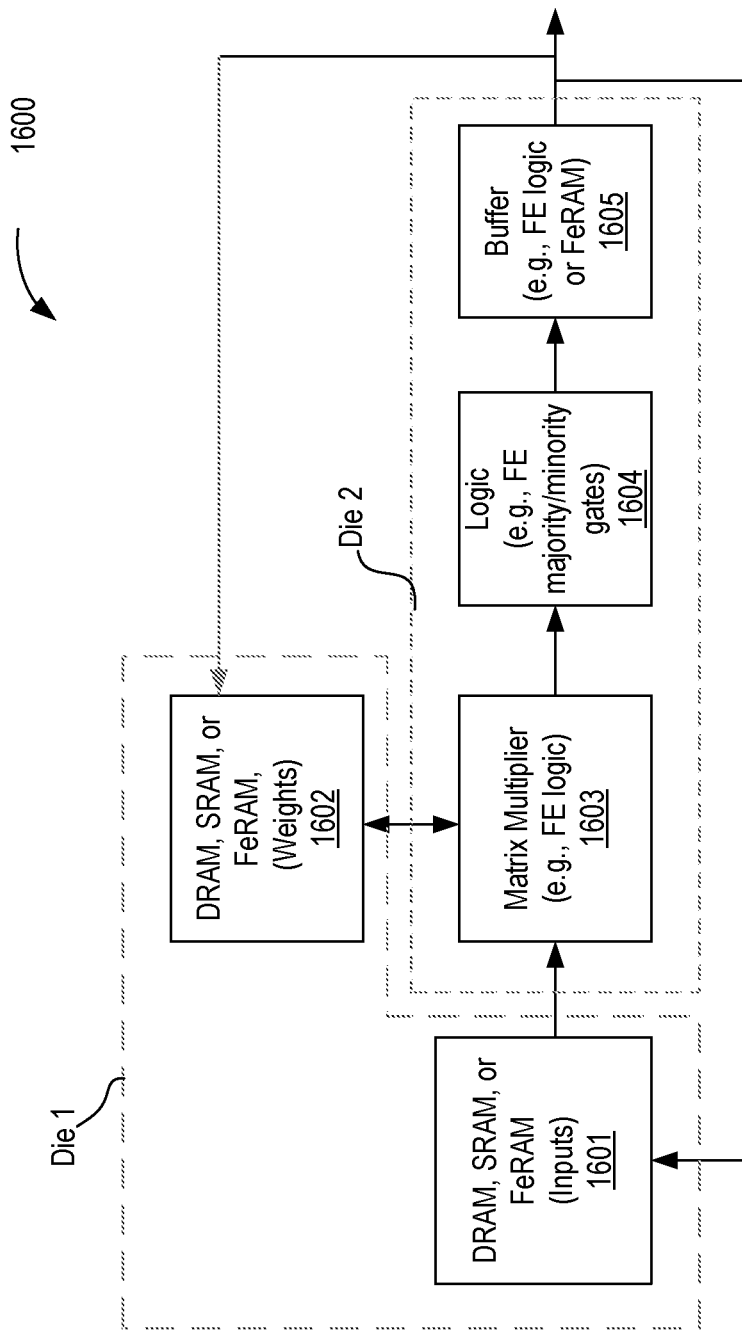
FIG. 15 illustrates an architecture of a computational block comprising a compute die stacked with a memory die, wherein the compute die includes any one of the asynchronous circuits, in accordance with some embodiments.

FIG. 15 illustrates an architecture of a computational block comprising a compute die stacked with a memory die, wherein the compute die includes any one of the asynchronous circuits, in accordance with some embodiments. Any of the blocks here can include the bit-cell of various embodiments. The architecture of FIG. 15 illustrates an architecture for a special purpose compute die where RAM memory buffers for inputs and weights are split on die-1 and logic and optional memory buffers are split on die-2.

In some embodiments, memory die (e.g., Die 1) is positioned below a compute die (e.g., Die 2) such that a heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 1601 to store input data and a second die 1602 to store weight factors. In some embodiments, the memory die is a single die that is partitioned such that first partition 1601 of the memory die is used to store input data and second partition 1602 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 1601 and 1602, or memory dies 1601 and 1602 include one or more of: DRAM, FE-SRAM, FE-DRAM, SRAM, and/or MRAM. In some embodiments, the input data stored in memory partition or die 1601 is the data to be analyzed by a trained model with fixed weights stored in memory partition or die 1602.

In some embodiments, the compute die comprises ferroelectric or paraelectric logic (e.g., majority, minority, and/or threshold gates) to implement matrix multiplier 1603, logic 1604, and temporary buffer 1605. Matrix multiplier 1603 performs multiplication operation on input data 'X' and weights 'W' to generate an output 'Y'. This output may be further processed by logic 1604. In some embodiments, logic 1604 performs a threshold operation, pooling and drop out operations, and/or concatenation operations to complete the AI logic primitive functions.

In some embodiments, the output of logic 1604 (e.g., processed output 'Y') is temporarily stored in buffer 1605. In some embodiments, buffer 1605 is memory such as one or more of: DRAM, Fe-SRAM, Fe-DRAM, MRAM, resistive RAM (Re-RAM) and/or SRAM. In some embodiments, buffer 1605 is part of the memory die (e.g., Die 1). In some embodiments, buffer 1605 performs the function of a re-timer. In some embodiments, the output of buffer 1605 (e.g., processed output 'Y') is used to modify the weights in memory partition or die 1602. In one such embodiment, computational block 1600 not only operates as an inference circuitry, but also as a training circuitry to train a model. In some embodiments, matrix multiplier 1603 includes an array of multiplier cells, wherein the DRAMs 1601 and 1602 include arrays of memory bit-cells, respectively, wherein each multiplier cell is coupled to a corresponding memory bit-cell of DRAM 1601 and/or DRAM 1602. In some embodiments, computational block 1600 comprises an interconnect fabric coupled to the array of multiplier cells such that each multiplier cell is coupled to the interconnect fabric.

Architecture 1600 provides reduced memory access for the compute die (e.g., die 2) by providing data locality for weights, inputs, and outputs. In one example, data from and to the AI computational blocks (e.g., matrix multiplier 1603) is locally processed within a same packaging unit. Architecture 1600 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 16:
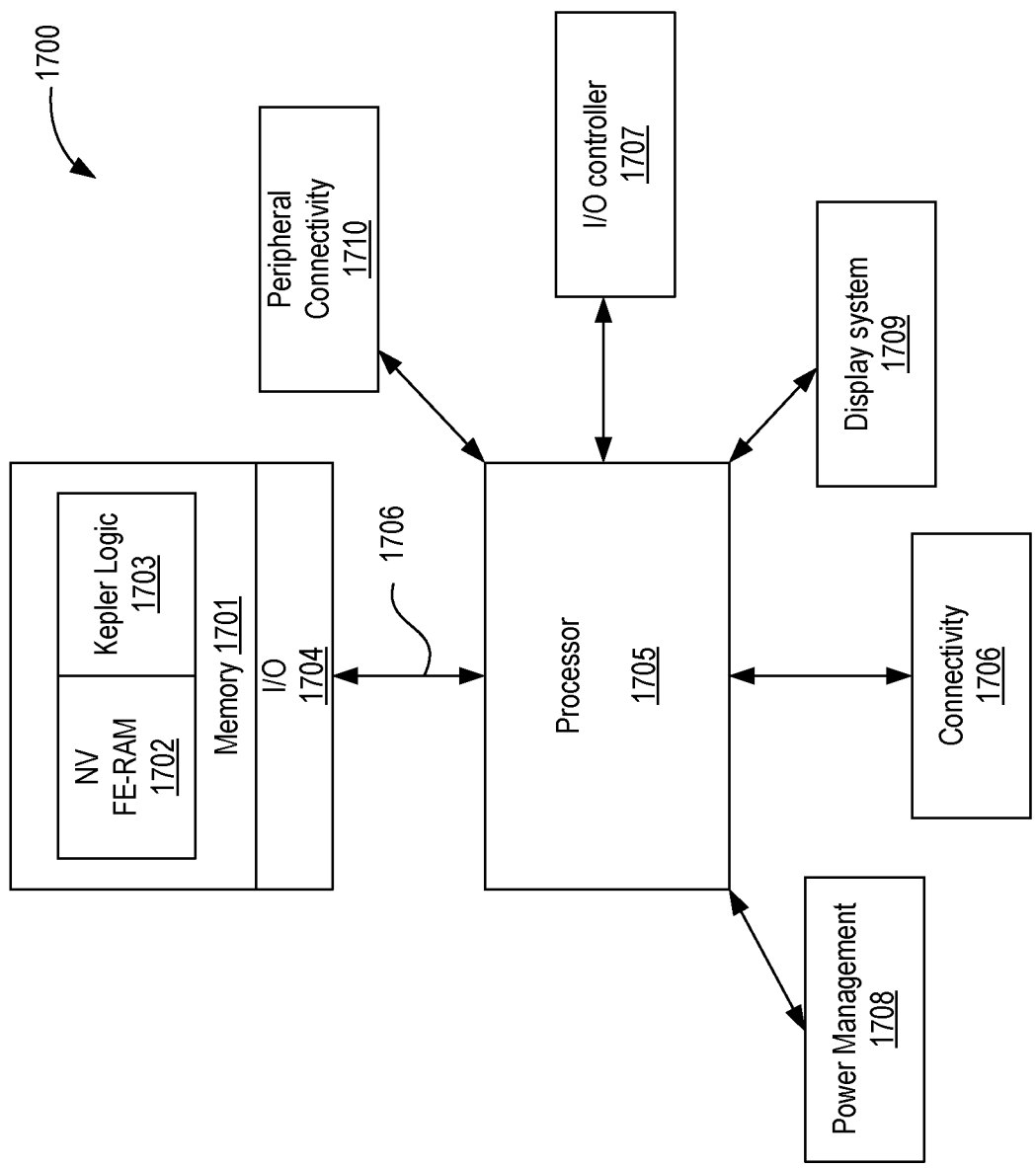
FIG. 16 illustrates a system-on-chip (SOC) that uses any one of the asynchronous circuits, in accordance with some embodiments.

FIG. 16 illustrates a system-on-chip (SOC) that uses any one of the asynchronous circuits, in accordance with some embodiments. SoC 1700 comprises memory 1701 having static random-access memory (SRAM) or FE based random-access memory FERAM, or any other suitable memory. The memory can be non-volatile (NV) or volatile memory. Memory 1701 may also comprise logic 1703 to control memory 1702. For example, write and read drivers are part of logic 1703. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 1704. The interface may be a double-data rate (DDR) compliant interface or any other suitable interface to communicate with a processor. Processor 1705 of SoC 1700 can be a single core or multiple core processor. Processor 1705 can be a general-purpose processor (CPU), a digital signal processor (DSP), or an Application Specific Integrated Circuit (ASIC) processor. In some embodiments, processor

1705 is an artificial intelligence (AI) processor (e.g., a dedicated AI processor, a graphics processor configured as an AI processor). In various embodiments, processor 1705 executes instructions that are stored in memory 1701.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 1705 may be coupled to a number of other chiplets that can be on the same die as SoC 1700 or on separate dies. These chiplets include connectivity circuitry 1706, I/O controller 1707, power management 1708, and display system 1709, and peripheral connectivity 1706.

Connectivity 1706 represents hardware devices and software components for communicating with other devices. Connectivity 1706 may support various connectivity circuitries and standards. For example, connectivity 1706 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1706 may support non-cellular standards such as WiFi.

I/O controller 1707 represents hardware devices and software components related to interaction with a user. I/O controller 1707 is operable to manage hardware that is part of an audio subsystem and/or display subsystem. For example, input through a microphone or other audio device can provide input or commands for one or more applications or functions of SoC 1700. In some embodiments, I/O controller 1707 illustrates a connection point for additional devices that connect to SoC 1700 through which a user might interact with the system. For example, devices that can be attached to the SoC 1700 might include microphone devices, speaker or stereo systems, video systems or other display devices, keyboard or keypad devices, or other I/O devices for use with specific applications such as card readers or other devices.

Power management 1708 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1708 may accordingly put such logic into low power state without the worry of losing data. Power management may select a power state according to Advanced Configuration and Power Interface (ACPI) specification for one or all components of SoC 1700.

Display system 1709 represents hardware (e.g., display devices) and software (e.g., drivers) components that provide a visual and/or tactile display for a user to interact with the processor 1705. In some embodiments, display system 1709 includes a touch screen (or touch pad) device that provides both output and input to a user. Display system 1709 may include a display interface, which includes the particular screen or hardware device used to provide a display to a user. In some embodiments, the display interface includes logic separate from processor 1705 to perform at least some processing related to the display.

Peripheral connectivity 1710 may represent hardware devices and/or software devices for connecting to peripheral devices such as printers, chargers, cameras, etc. In some embodiments, peripheral connectivity 1710 may support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 1700 includes a coherent cache or memory-side buffer chiplet (not shown) which include ferroelectric or paraelectric memory. The coherent cache or memory-side buffer chiplet can be coupled to processor 1705 and/or memory 1701 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures or circuits of various embodiments described herein can also be described as method of forming those structures, and method of operation of these structures. These methods can be implemented as machine-readable instructions in a machine-readable storage media. When these machine-readable instructions are executed by one or more processors, the method is executed.

Following examples are provided that illustrate the various embodiments. The examples can be combined with other examples. As such, various embodiments can be combined with other embodiments without changing the scope of the invention.

Example 1: An apparatus comprising: a first threshold gate to receive a first set of inputs and to generate a first output in accordance with a first threshold of the first threshold gate and in accordance with logic values of the first set of inputs; a first transistor having a first gate terminal coupled to the first output; a second threshold gate to receive a second set of inputs and to generate a second output in accordance with a second threshold of the second threshold gate and in accordance with logic values of the second set of inputs; and a second transistor having a second gate terminal coupled to the second output, wherein the first transistor and the second transistor are coupled in series.

Example 2: The apparatus of example 1, wherein the first threshold gate, the first transistor, the second threshold gate, and the second transistor are part of an asynchronous circuit.

Example 3: The apparatus of example 1, wherein the first transistor is a p-type transistor, and wherein the second transistor is a n-type transistor.

Example 4: The apparatus of example 1 comprises a memory circuitry coupled to the first transistor and the second transistor.

Example 5: The apparatus of example 4, wherein the memory circuitry includes a first inversion circuitry and a second inversion circuitry, wherein the first inversion circuitry is coupled to the second inversion circuitry in a ring configuration.

Example 6: The apparatus of example 1, wherein the first threshold gate comprises: a first capacitor having a first terminal coupled to receive a first input of the first set of inputs, the first capacitor having a second terminal coupled to a first summing node; and a second capacitor having a third terminal coupled to receive a second input of the first set of inputs, the second capacitor having a fourth terminal coupled to the first summing node.

Example 7: The apparatus of example 6, wherein the first summing node is coupled to the first gate terminal of the first transistor.

Example 8: The apparatus of example 6, wherein the first capacitor and the second capacitor have linear dielectric.

Example 9: The apparatus of example 1, wherein the second threshold gate comprises: a first capacitor having a first terminal coupled to receive a first input of the second set of inputs, the first capacitor having a second terminal coupled to a second summing node; and a second capacitor having a third terminal coupled to receive a second input of the second set of inputs, the second capacitor having a fourth terminal coupled to the second summing node.

Example 10: The apparatus of example 9, wherein the second summing node is coupled to the second gate terminal of the second transistor.

Example 11: The apparatus of example 9, wherein the first capacitor and the second capacitor have linear dielectric.

Example 12: The apparatus of example 9, wherein the first capacitor and the second capacitor have non-linear polar dielectric.

Example 13: The apparatus of example 12, wherein the non-linear polar dielectric includes a ferroelectric material or a paraelectric material.

Example 14: The apparatus of example 13, wherein the ferroelectric material includes one or more of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); a perovskite which includes one of: $BaTiO_3$, $PbTiO_3$, $KNbO_3$, or $NaTaO_3$; a hexagonal ferroelectric which includes one of: $YMnO_3$, or $LuFeO_3$; hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as $Hf_{1-x}E_xO_y$, where E can be Al, Ca, Ce, Dy, er, Gd, Ge, La, Sc, Si, Sr, Sn, or Y; $Al_{(1-x)}Sc_{(x)}N$, $Ga_{(1-x)}Sc_{(x)}N$, $Al_{(1-x)}Y_{(x)}N$ or $Al_{(1-x-y)}Mg_{(x)}Nb_{(y)}N$, y doped $HfO_2$, where x includes one of: Al, Ca, Ce, Dy, Er, Gd, Ge, La, Sc, Si, Sr, Sn, or Y, wherein 'x' is a fraction; Niobate type compounds $LiNbO_3$, $LiTaO_3$, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO]n, where 'n' is between 1 to 100.

Example 15: The apparatus of example 13, wherein the paraelectric material includes one or more of: $SrTiO_3$, $Ba_{(x)}Sr_{(y)}TiO_3$ (where x is −0.5, and y is 0.95), $HfZrO_2$, Hf—Si—O, $BaTiO_3$, La-substituted $PbTiO_3$, lead zirconate titanate, or PMN-PT (lead magnesium niobate-lead titanate) based relaxor ferroelectrics.

Example 16: An apparatus comprising: a first transistor of a first conductivity type; a second transistor of a second conductivity type, wherein the second transistor is coupled is series with the first transistor, wherein the first conductivity type is different from the second conductivity type; a first threshold gate comprising a first capacitive input circuit, wherein the first threshold gate is to drive the first transistor; and a second threshold gate comprising a second capacitive input circuit, wherein the second threshold gate is to drive the second transistor.

Example 17: The apparatus of example 16, wherein the first threshold gate and the second threshold gate have adjustable thresholds.

Example 18: The apparatus of example 16, wherein the first capacitive input circuit includes capacitors which comprises one of: linear dielectric, paraelectric dielectric, or ferroelectric dielectric.

Example 19: A system comprising: a memory circuitry to store one or more instructions; a processor circuitry coupled to the memory circuitry; and a communication interface coupled to the processor circuitry, wherein the processor circuitry is to execute the one or more instructions, wherein the processor circuitry includes an asynchronous circuitry, wherein the asynchronous circuitry includes: a first transistor of a first conductivity type; a second transistor of a second conductivity type, wherein the second transistor is coupled is series with the first transistor, wherein the first conductivity type is different from the second conductivity type; a first threshold gate comprising a first capacitive input circuit, wherein first threshold gate is to drive the first transistor; and a second threshold gate comprising a second capacitive input circuit, wherein second threshold gate is to drive the second transistor.

Example 20: The system of example 19, wherein the first threshold gate and the second threshold gate have adjustable thresholds.

Example 1a: An apparatus comprising: a first majority or minority gate to receive a first set of inputs and to generate a first output in accordance with a first majority or minority function of the first majority or minority gate and in accordance with logic values of the first set of inputs; a first transistor having a first gate terminal coupled to the first output; a second majority or minority gate to receive a second set of inputs and to generate a second output in accordance with a second majority or minority function of the second majority or minority gate and in accordance with logic values of the second set of inputs; and a second transistor having a second gate terminal coupled to the second output, wherein the first transistor and the second transistor are coupled in series.

Example 2a: The apparatus of example 1a, wherein the first majority or minority gate, the first transistor, the second majority or minority gate, and the second transistor are part of an asynchronous circuit.

Example 3a: The apparatus of example 1a, wherein the first transistor is a p-type transistor, and wherein the second transistor is a n-type transistor.

Example 4a: The apparatus of example 1a comprises a memory circuitry coupled to the first transistor and the second transistor.

Example 5a: The apparatus of example 4a, wherein the memory circuitry includes a first inversion circuitry and a second inversion circuitry, wherein the first inversion circuitry is coupled to the second inversion circuitry in a ring configuration.

Example 6a: The apparatus of example 1a, wherein the first majority or minority gate comprises: a first capacitor having a first terminal coupled to receive a first input of the first set of inputs, the first capacitor having a second terminal coupled to a first summing node; and a second capacitor having a third terminal coupled to receive a second input of the first set of inputs, the second capacitor having a fourth terminal coupled to the first summing node.

Example 7a: The apparatus of example 6a, wherein the first summing node is coupled to the first gate terminal of the first transistor.

Example 8a: The apparatus of example 6a, wherein the first capacitor and the second capacitor have linear dielectric.

Example 9a: The apparatus of example 1a, wherein the second majority or minority gate comprises: a first capacitor having a first terminal coupled to receive a second input of the second set of inputs, the first capacitor having a second terminal coupled to a second summing node; and a second capacitor having a third terminal coupled to receive a second input of the second set of inputs, the second capacitor having a fourth terminal coupled to the second summing node.

Example 10a: The apparatus of example 9a, wherein the second summing node is coupled to the second gate terminal of the second transistor.

Example 11a: The apparatus of example 9a, wherein the first capacitor and the second capacitor have linear dielectric.

Example 12a: The apparatus of example 9a, wherein the first capacitor and the second capacitor have non-linear polar dielectric.

Example 13a: The apparatus of example 12a, wherein the non-linear polar dielectric includes a ferroelectric material or a paraelectric material.

Example 14a: The apparatus of example 13a, wherein the ferroelectric material includes one or more of the ferroelectrics described herein.

Example 15a: The apparatus of example 13a, wherein the paraelectric material includes one or more of the paraelectric described herein.

Example 16a: An apparatus comprising: a first transistor of a first conductivity type; a second transistor of a second conductivity type, wherein the second transistor is coupled is series with the first transistor, wherein the first conductivity type is different from the second conductivity type; a first majority or minority gate comprising a first capacitive input circuit, wherein first majority or minority gate is to drive the first transistor; and a second majority or minority gate comprising a second capacitive input circuit, wherein second majority or minority gate is to drive the second transistor.

Example 17a: The apparatus of example 16a, wherein the first majority or minority gate is configured as an OR gate, and wherein the second majority or minority gate is configured as an AND gate.

Example 18a: The apparatus of example 16a, wherein the first capacitive input circuit includes capacitors which comprises one of: linear dielectric, paraelectric dielectric, or ferroelectric dielectric.

Example 19a: A system comprising: a memory circuitry to store one or more instructions; a processor circuitry coupled to the memory circuitry; and a communication interface coupled to the processor circuitry, wherein the processor circuitry is to execute the one or more instructions, wherein the processor circuitry includes an asynchronous circuitry, wherein the asynchronous circuitry includes: a first transistor of a first conductivity type; a second transistor of a second conductivity type, wherein the second transistor is coupled is series with the first transistor, wherein the first conductivity type is different from the second conductivity type; a first majority or minority gate comprising a first capacitive input circuit, wherein first majority or minority gate is to drive the first transistor; and a second majority or minority gate comprising a second capacitive input circuit, wherein second majority or minority gate is to drive the second transistor.

Example 20a: The system of example 19a, wherein the first majority or minority gate is a first 7-input majority or minority gate, and wherein the second majority or minority gate is a second 7-input majority or minority gate.

Example 1b: An apparatus comprising: a first majority or minority gate to receive a first set of inputs and to generate a first output in accordance with a first majority or minority function of the first majority or minority gate and in accordance with logic values of the first set of inputs; a first transistor having a first gate terminal coupled to the first output; a second majority or minority gate to receive a second set of inputs and to generate a second output in accordance with a second majority or minority function of the second majority or minority gate and in accordance with logic values of the second set of inputs; a second transistor having a second gate terminal coupled to the second output; a third majority or minority gate to receive a third set of inputs and to generate a third output in accordance with a third majority or minority function of the third majority or minority gate and in accordance with logic values of the third set of inputs; a third transistor having a third gate terminal coupled to the third output; a fourth majority or minority gate to receive a fourth set of inputs and to generate a fourth output in accordance with a fourth majority or minority function of the fourth majority or minority gate and in accordance with logic values of the fourth set of inputs; and a fourth transistor having a fourth gate terminal coupled to the fourth output, wherein the first transistor, the second transistor, third transistor and the fourth transistor are coupled in series.

Example 2b: The apparatus of example 1b, wherein the first majority or minority gate, the first transistor, the second majority or minority gate, the second transistor, the third majority or minority gate, the third transistor, the fourth majority or minority gate, and the fourth transistor are part of an asynchronous circuit.

Example 3b: The apparatus of example 1b, wherein the first transistor is a first p-type transistor, wherein the second transistor is a second p-type transistor, wherein the third transistor is a first n-type transistor, and wherein the fourth transistor is a second n-type transistor.

Example 4b: The apparatus of example 1b comprises a memory circuitry coupled to the second transistor and the third transistor.

Example 5b: The apparatus of example 4b, wherein the memory circuitry includes a first inversion circuitry and a second inversion circuitry, wherein the first inversion circuitry is coupled to the second inversion circuitry in a ring configuration.

Example 6b: The apparatus of example 1b, wherein the first majority or minority gate comprises: a first capacitor having a first terminal coupled to receive a first input of the first set of inputs, the first capacitor having a second terminal coupled to a first summing node; and a second capacitor having a third terminal coupled to receive a second input of the first set of inputs, the second capacitor having a fourth terminal coupled to the first summing node.

Example 7b: The apparatus of example 6b, wherein the first summing node is coupled to the first gate terminal of the first transistor.

Example 8b: The apparatus of example 6b, wherein the first capacitor and the second capacitor have linear dielectric.

Example 9b: The apparatus of example 1b, wherein the second majority or minority gate comprises: a first capacitor having a first terminal coupled to receive a first input of the second set of inputs, the first capacitor having a second terminal coupled to a second summing node; and a second capacitor having a third terminal coupled to receive a second input of the second set of inputs, the second capacitor having a fourth terminal coupled to the second summing node.

Example 10b: The apparatus of example 9b, wherein the second summing node is coupled to the second gate terminal of the second transistor.

Example 11b: The apparatus of example 9b, wherein the first capacitor and the second capacitor have linear dielectric.

Example 12b: The apparatus of example 9b, wherein the first capacitor and the second capacitor have non-linear polar dielectric.

Example 13b: The apparatus of example 12b, wherein the non-linear polar dielectric includes a ferroelectric material or a paraelectric material.

Example 14b: The apparatus of example 13b, wherein the ferroelectric material includes any of the ferroelectric materials discussed herein.

Example 15b: The apparatus of example 13b, wherein the paraelectric material includes one or more of the paraelectric materials discussed herein.

Example 16b: An apparatus comprising: a first transistor of a first conductivity type; a second transistor of the first conductivity type, the first transistor coupled in series with the second transistor; a third transistor of a second conductivity type, wherein the first conductivity type is different from the second conductivity type; a fourth transistor of the second conductivity type, wherein the third transistor coupled in series with the fourth transistor, wherein the third transistor is coupled to the second transistor; a first majority or minority gate comprising a first capacitive input circuit, wherein first majority or minority gate is to drive the first transistor; a second majority or minority gate comprising a second capacitive input circuit, wherein second majority or minority gate is to drive the second transistor; a third majority or minority gate comprising a third capacitive input circuit, wherein third majority or minority gate is to drive the third transistor; and a fourth majority or minority gate comprising a fourth capacitive input circuit, wherein fourth majority or minority gate is to drive the fourth transistor.

Example 17b: The apparatus of example 16b, wherein the first majority or minority gate is configured as a first OR gate, wherein the second majority or minority gate is configured as a second OR gate, wherein the third majority or minority gate is configured as a first AND gate, wherein the fourth majority or minority gate is configured as a second AND gate.

Example 18b: The apparatus of example 16b, wherein the first capacitive input circuit includes capacitors which comprises one of: linear dielectric, paraelectric dielectric, or ferroelectric dielectric.

Example 19b: A system comprising: a memory circuitry to store one or more instructions; a processor circuitry coupled to the memory circuitry; and a communication interface coupled to the processor circuitry, wherein the processor circuitry is to execute the one or more instructions, wherein the processor circuitry includes an asynchronous circuitry, wherein the asynchronous circuitry includes: a first transistor of a first conductivity type; a second transistor of the first conductivity type, the first transistor coupled in series with the second transistor; a third transistor of a second conductivity type, wherein the first conductivity type is different from the second conductivity type; a fourth transistor of the second conductivity type, wherein the third transistor coupled in series with the fourth transistor, wherein the third transistor is coupled to the second transistor; a first majority or minority gate comprising a first capacitive input circuit, wherein first majority or minority gate is to drive the first transistor; a second majority or minority gate comprising a second capacitive input circuit, wherein second majority or minority gate is to drive the second transistor; a third majority or minority gate comprising a third capacitive input circuit, wherein third majority or minority gate is to drive the third transistor; and a fourth majority or minority gate comprising a fourth capacitive input circuit, wherein fourth majority or minority gate is to drive the fourth transistor.

Example 20b: The system of example 19b, wherein the first majority or minority gate is configured as a first OR gate, wherein the second majority or minority gate is configured as a second OR gate, wherein the third majority or minority gate is configured as a first AND gate, wherein the fourth majority or minority gate is configured as a second AND gate.

Example 1c: An apparatus comprising: a first majority or minority gate to receive a first set of inputs and to generate a first output in accordance with a first majority or minority function of the first majority or minority gate and in accordance with logic values of the first set of inputs; a first transistor having a first gate terminal coupled to the first output; a second majority or minority gate to receive a second set of inputs and to generate a second output in accordance with a second majority or minority function of the second majority or minority gate and in accordance with logic values of the second set of inputs; and a second transistor having a second gate terminal coupled to the second output, wherein the second transistor is parallel to the first transistor.

Example 2c: The apparatus of example 1c comprising: a third majority or minority gate to receive a third set of inputs and to generate a third output in accordance with a third majority or minority function of the third majority or minority gate and in accordance with logic values of the third set of inputs; a third transistor having a third gate terminal coupled to the third output; and a fourth transistor which is parallel to the third transistor, wherein the first transistor, the second transistor, the third transistor, and the fourth transistor are coupled to an output node.

Example 3c: The apparatus of example 2c, wherein the third majority or minority gate is 3-input majority gate, with an input tied to a power supply node.

Example 4c: The apparatus of example 2c, wherein the third transistor and the fourth transistor are of a p-type conductivity.

Example 5c: The apparatus of example 1c, wherein the first majority or minority gate is 3-input majority gate, with an input tied to a ground supply node.

Example 6c: The apparatus of example 1c, wherein the second majority or minority gate is a 5-input majority gate with two inputs tied to a ground supply node.

Example 7c: The apparatus of example 1c, wherein the first transistor and the second transistor are of n-type conductivity.

Example 8c: The apparatus of example 2c, wherein the first majority or minority gate, the first transistor, the second majority or minority gate, the second transistor, the third majority or minority gate, the third transistor, and the fourth transistor are part of an asynchronous circuit.

Example 9c: The apparatus of example 2c comprises a memory circuitry coupled to the output node.

Example 10c: The apparatus of example 9c, wherein the memory circuitry includes a first inversion circuitry and a second inversion circuitry, wherein the first inversion circuitry is coupled to the second inversion circuitry in a ring configuration.

Example 11c: The apparatus of example 1c, wherein the first majority or minority gate comprises: a first capacitor having a first terminal coupled to receive a first input of the first set of inputs, the first capacitor having a second terminal coupled to a first summing node; and a second capacitor having a third terminal coupled to receive a second input of the first set of inputs, the second capacitor having a fourth terminal coupled to the first summing node.

Example 12c: The apparatus of example 11c, wherein the first summing node is coupled to the first gate terminal of the first transistor.

Example 13c: The apparatus of example 11c, wherein the first capacitor and the second capacitor have linear dielectric.

Example 14c: The apparatus of example 11c, wherein the first capacitor and the second capacitor have non-linear polar dielectric.

Example 15c: The apparatus of example 14c, wherein the non-linear polar dielectric includes ferroelectric material.

Example 16c: The apparatus of example 14c, wherein the non-linear polar dielectric includes paraelectric material.

Example 17c: An apparatus comprising: a first set of transistors of a first conductivity type, wherein the first set of transistors are parallel to one another and coupled to a first supply rail and an output node; a second set of transistors of a second conductivity type, wherein the second set of transistors are parallel to one another and coupled to a second supply rail and the output node; and a first majority or minority gate to receive a first set of inputs and to generate a first output in accordance with a first majority or minority function of the first majority or minority gate and in accordance with logic values of the first set of inputs, wherein the first output is to drive an individual transistor of the first set of transistors.

Example 18c: The apparatus of example 17c comprises: a second majority or minority gate to receive a second set of inputs and to generate a second output in accordance with a second majority or minority function of the second majority or minority gate and in accordance with logic values of the second set of inputs, wherein the second output is to drive an individual transistor of the second set of transistors.

Example 19c: The apparatus of example 18c, wherein the first majority or minority gate is an OR gate, and wherein the second majority or minority gate is a AND gate.

Example 20c: A system comprising: a memory circuitry to store one or more instructions; a processor circuitry coupled to the memory circuitry; and a communication interface coupled to the processor circuitry, wherein the processor circuitry is to execute the one or more instructions, wherein the processor circuitry includes an asynchronous circuitry, wherein the asynchronous circuitry includes: a first set of transistors of a first conductivity type, wherein the first set of transistors are parallel to one another and coupled to a first supply rail and an output node; a second set of transistors of a second conductivity type, wherein the second set of transistors are parallel to one another and coupled to a second supply rail and the output node; and a first majority or minority gate to receive a first set of inputs and to generate a first output in accordance with a first majority or minority function of the first majority or minority gate and in accordance with logic values of the first set of inputs, wherein the first output is to drive an individual transistor of the first set of transistors.

Example 1d: An apparatus comprising: a first threshold to receive a first set of inputs and to generate a first output in accordance with a first threshold gate and in accordance with logic values of the first set of inputs; a first transistor having a first gate terminal coupled to the first output; a second threshold gate to receive a second set of inputs and to generate a second output in accordance with a second threshold and in accordance with logic values of the second set of inputs; and a second transistor having a second gate terminal coupled to the second output, wherein the second transistor is parallel to the first transistor.

Example 2d: The apparatus of example 1d comprising: a third threshold gate to receive a third set of inputs and to generate a third output in accordance with a third threshold and in accordance with logic values of the third set of inputs; a third transistor having a third gate terminal coupled to the third output; and a fourth transistor which is parallel to the third transistor, wherein the first transistor, the second transistor, the third transistor, and the fourth transistor are coupled to an output node.

Example 3d: The apparatus of example 2d, wherein the third threshold gate has a threshold of 1.

Example 4d: The apparatus of example 2d, wherein the third transistor and the fourth transistor are of a p-type conductivity.

Example 5d: The apparatus of example 1d, wherein the first threshold gate has a threshold of 2.

Example 6d: The apparatus of example 1d, wherein the second threshold gate has a threshold of 3.

Example 7d: The apparatus of example 1d, wherein the first transistor and the second transistor are of n-type conductivity.

Example 8d: The apparatus of example 2d, wherein the first threshold gate, the first transistor, the second threshold gate, the second transistor, the third threshold gate, the third transistor, and the fourth transistor are part of an asynchronous circuit.

Example 9d: The apparatus of example 2d comprises a memory circuitry coupled to the output node.

Example 10d: The apparatus of example 9d, wherein the memory circuitry includes a first inversion circuitry and a second inversion circuitry, wherein the first inversion circuitry is coupled to the second inversion circuitry in a ring configuration.

Example 11d: The apparatus of example 1d, wherein the first threshold gate comprises: a first capacitor having a first terminal coupled to receive a first input of the first set of inputs, the first capacitor having a second terminal coupled to a first summing node; and a second capacitor having a third terminal coupled to receive a second input of the first set of inputs, the second capacitor having a fourth terminal coupled to the first summing node.

Example 12d: The apparatus of example 11d, wherein the first summing node is coupled to the first gate terminal of the first transistor.

Example 13d: The apparatus of example 11d, wherein the first capacitor and the second capacitor have linear dielectric.

Example 14d: The apparatus of example 11d, wherein the first capacitor and the second capacitor have non-linear polar dielectric.

Example 15d: The apparatus of example 14d, wherein the non-linear polar dielectric includes any one of the ferroelectric materials discussed herein.

Example 16d: The apparatus of example 14d, wherein the non-linear polar dielectric includes any one of the paraelectric materials discussed herein.

Example 17d: An apparatus comprising: a first set of transistors of a first conductivity type, wherein the first set of transistors are parallel to one another and coupled to a first supply rail and an output node; a second set of transistors of a second conductivity type, wherein the second set of transistors are parallel to one another and coupled to a second supply rail and the output node; and a first threshold gate to receive a first set of inputs and to generate a first output in accordance with a first threshold and in accordance with logic values of the first set of inputs, wherein the first output is to drive an individual transistor of the first set of transistors.

Example 18d: The apparatus of example 17d comprises: a second threshold gate to receive a second set of inputs and to generate a second output in accordance with a second threshold and in accordance with logic values of the second set of inputs, wherein the second output is to drive an individual transistor of the second set of transistors.

Example 19d: The apparatus of example 18d, wherein the first threshold is a threshold of 1, and wherein the second threshold is a threshold of 2.

Example 20d: A system comprising: a memory circuitry to store one or more instructions; a processor circuitry coupled to the memory circuitry; and a communication interface coupled to the processor circuitry, wherein the processor circuitry is to execute the one or more instructions, wherein the processor circuitry includes an asynchronous circuitry, wherein the asynchronous circuitry includes: a first set of transistors of a first conductivity type, wherein the first set of transistors are parallel to one another and coupled to a first supply rail and an output node; a second set of transistors of a second conductivity type, wherein the second set of transistors are parallel to one another and coupled to a second supply rail and the output node; and a first threshold gate to receive a first set of inputs and to generate a first output in accordance with a first threshold and in accordance with logic values of the first set of inputs, wherein the first output is to drive an individual transistor of the first set of transistors.

Example 1e: An apparatus comprising: a first threshold gate to receive a first set of inputs and to generate a first output in accordance with a first threshold and in accordance with logic values of the first set of inputs; a first transistor having a first gate terminal coupled to the first output; a second threshold gate to receive a second set of inputs and to generate a second output in accordance with a second threshold and in accordance with logic values of the second set of inputs; a second transistor having a second gate terminal coupled to the second output; a third threshold gate to receive a third set of inputs and to generate a third output in accordance with a third threshold and in accordance with logic values of the third set of inputs; a third transistor having a third gate terminal coupled to the third output; a fourth threshold gate to receive a fourth set of inputs and to generate a fourth output in accordance with a fourth threshold and in accordance with logic values of the fourth set of inputs; and a fourth transistor having a fourth gate terminal coupled to the fourth output, wherein the first transistor, the second transistor, third transistor and the fourth transistor are coupled in series.

Example 2e: The apparatus of example 1e, wherein the first threshold gate, the first transistor, the second threshold gate, the second transistor, the third threshold gate, the third transistor, the fourth threshold gate, and the fourth transistor are part of an asynchronous circuit.

Example 3e: The apparatus of example 1e, wherein the first transistor is a first p-type transistor, wherein the second transistor is a second p-type transistor, wherein the third transistor is a first n-type transistor, and wherein the fourth transistor is a second n-type transistor.

Example 4e: The apparatus of example 1e comprises a memory circuitry coupled to the second transistor and the third transistor.

Example 5e: The apparatus of example 4e, wherein the memory circuitry includes a first inversion circuitry and a second inversion circuitry, wherein the first inversion circuitry is coupled to the second inversion circuitry in a ring configuration.

Example 6e: The apparatus of example 1e, wherein the first threshold gate comprises: a first capacitor having a first terminal coupled to receive a first input of the first set of inputs, the first capacitor having a second terminal coupled to a first summing node; and a second capacitor having a third terminal coupled to receive a second input of the first set of inputs, the second capacitor having a fourth terminal coupled to the first summing node.

Example 7e: The apparatus of example 6e, wherein the first summing node is coupled to the first gate terminal of the first transistor.

Example 8e: The apparatus of example 6e, wherein the first capacitor and the second capacitor have linear dielectric.

Example 9e: The apparatus of example 1e, wherein the second threshold gate comprises: a first capacitor having a first terminal coupled to receive a first input of the second set of inputs, the first capacitor having a second terminal coupled to a second summing node; and a second capacitor having a third terminal coupled to receive a second input of the second set of inputs, the second capacitor having a fourth terminal coupled to the second summing node.

Example 10e: The apparatus of example 9e, wherein the second summing node is coupled to the second gate terminal of the second transistor.

Example 11e: The apparatus of example 9e, wherein the first capacitor and the second capacitor have linear dielectric.

Example 12e: The apparatus of example 9e, wherein the first capacitor and the second capacitor have non-linear polar dielectric.

Example 13e: The apparatus of example 12e, wherein the non-linear polar dielectric includes a ferroelectric material or a paraelectric material.

Example 14e: The apparatus of example 13e, wherein the ferroelectric material includes any of the ferroelectric materials discussed herein.

Example 15e: The apparatus of example 13e, wherein the paraelectric material includes any of the paraelectric materials discussed herein.

Example 16e: An apparatus comprising: a first transistor of a first conductivity type; a second transistor of the first conductivity type, the first transistor coupled in series with the second transistor; a third transistor of a second conductivity type; a fourth transistor of the second conductivity type, wherein the third transistor coupled in series with the fourth transistor, wherein the third transistor is coupled to the second transistor; a first threshold gate comprising a first capacitive input circuit, wherein first threshold gate is to drive the first transistor; a second threshold gate comprising a second capacitive input circuit, wherein second threshold gate is to drive the second transistor; a third threshold gate comprising a third capacitive input circuit, wherein third threshold gate is to drive the third transistor; and a fourth threshold gate comprising a fourth capacitive input circuit, wherein fourth threshold gate is to drive the fourth transistor.

Example 17e: The apparatus of example 16e, wherein the first threshold gate has a first threshold, wherein the second threshold gate has the first threshold, wherein the third threshold gate has a second threshold, wherein the fourth threshold gate has the second threshold, wherein the first threshold is lower than the second threshold.

Example 18e: The apparatus of example 16e, wherein the first capacitive input circuit includes capacitors which comprises one of: linear dielectric, paraelectric dielectric, or ferroelectric dielectric.

Example 19e: A system comprising: a memory circuitry to store one or more instructions; a processor circuitry coupled to the memory circuitry; and a communication interface coupled to the processor circuitry, wherein the processor circuitry is to execute the one or more instructions, wherein the processor circuitry includes an asynchronous circuitry, wherein the asynchronous circuitry includes: a first transistor of a first conductivity type; a second transistor of the first conductivity type, the first transistor coupled in series with the second transistor; a third transistor of a second conductivity type; a fourth transistor of the second conductivity type, wherein the third transistor coupled in series with the fourth transistor, wherein the third transistor is coupled to the second transistor; a first threshold gate comprising a first capacitive input circuit, wherein first threshold gate is to drive the first transistor; a second threshold gate comprising a second capacitive input circuit, wherein second threshold gate is to drive the second transistor; a third threshold gate comprising a third capacitive input circuit, wherein third threshold gate is to drive the third transistor; and a fourth threshold gate comprising a fourth capacitive input circuit, wherein fourth threshold gate is to drive the fourth transistor.

Example 20e: The system of example 19e, wherein the first threshold gate has a first threshold, wherein the second threshold gate has the first threshold, wherein the third threshold gate has a second threshold, wherein the fourth threshold gate has the second threshold, wherein the first threshold is lower than the second threshold.

Example 1f: An apparatus comprising: a first majority or minority gate to receive a first set of inputs and to generate a first output in accordance with a first majority or minority function of the first majority or minority gate and in accordance with logic values of the first set of inputs; a first transistor having a first gate terminal coupled to the first output; a second majority or minority gate to receive a second set of inputs and to generate a second output in accordance with a second majority or minority function of the second majority or minority gate and in accordance with logic values of the second set of inputs; a second transistor having a second gate terminal coupled to the second output, wherein the first transistor and the second transistor are coupled in series; and a threshold gate coupled to the first output and a second output.

Example 2f: The apparatus of example 1f, wherein the threshold gate is to preserve a logic value when the first transistor and the second transistor are off.

Example 3f: The apparatus of example 1f, wherein the threshold gate is a 1-input capacitive circuit with a threshold of 1.

Example 4f: The apparatus of example 1f, wherein the threshold gate comprises: a capacitor having a first terminal coupled to the first output, and a second terminal coupled to the second terminal; and a third transistor coupled to the second output, wherein the third transistor is controllable by a first control.

Example 5f: The apparatus of example 4f, wherein the threshold gate comprises a fourth transistor coupled to the second output, wherein the fourth transistor is controllable by a second control, wherein the third transistor is a p-type transistor, and wherein the fourth transistor is an n-type transistor.

Example 6f: The apparatus of example 4f, wherein the capacitor comprises a paraelectric material or a ferroelectric material.

Example 7f: The apparatus of example 1f, wherein the first majority or minority gate, the first transistor, the second majority or minority gate, and the second transistor are part of an asynchronous circuit.

Example 8f: The apparatus of example 1f, wherein the first transistor is a p-type transistor, and wherein the second transistor is a n-type transistor.

Example 9f: The apparatus of example 1f, wherein the first majority or minority gate comprises: a first capacitor having a first terminal coupled to receive a first input of the first set of inputs, the first capacitor having a second terminal coupled to a first summing node; and a second capacitor having a third terminal coupled to receive a second input of the first set of inputs, the second capacitor having a fourth terminal coupled to the first summing node.

Example 10f: The apparatus of example 9f, wherein the first summing node is coupled to the first gate terminal of the first transistor.

Example 11f: The apparatus of example 9f, wherein the first capacitor and the second capacitor have linear dielectric.

Example 12f: The apparatus of example 1f, wherein the second majority or minority gate comprises: a first capacitor having a first terminal coupled to receive a second input of the second set of inputs, the first capacitor having a second terminal coupled to a second summing node; and a second capacitor having a third terminal coupled to receive a second input of the second set of inputs, the second capacitor having a fourth terminal coupled to the second summing node.

Example 13f: The apparatus of example 12f, wherein the second summing node is coupled to the second gate terminal of the second transistor.

Example 14f: The apparatus of example 12f, wherein the first capacitor and the second capacitor have linear dielectric.

Example 15f: The apparatus of example 12f, wherein the first capacitor and the second capacitor have non-linear polar dielectric.

Example 16f: The apparatus of example 15f, wherein the non-linear polar dielectric includes a ferroelectric material or a paraelectric material.

Example 17f: An apparatus comprising: a first transistor of a first conductivity type; a second transistor of a second conductivity type, wherein the second transistor is coupled is series with the first transistor, wherein the first conductivity type is different from the second conductivity type; a first majority or minority gate comprising a first capacitive input circuit, wherein first majority or minority gate is to drive the first transistor; a second majority or minority gate comprising a second capacitive input circuit, wherein second majority or minority gate is to drive the second transistor; and a threshold gate coupled to the first transistor and the second transistor.

Example 18f: The apparatus of example 17f, wherein the first majority or minority gate is configured as an OR gate, and wherein the second majority or minority gate is configured as an AND gate.

Example 19f: The apparatus of example 17f, wherein the first capacitive input circuit includes capacitors which comprises one of: linear dielectric, paraelectric dielectric, or ferroelectric dielectric.

Example 20f: A system comprising: a memory circuitry to store one or more instructions; a processor circuitry coupled to the memory circuitry; and a communication interface coupled to the processor circuitry, wherein the processor circuitry is to execute the one or more instructions, wherein the processor circuitry includes an asynchronous circuitry, wherein the asynchronous circuitry includes: a first transistor of a first conductivity type; a second transistor of a second conductivity type, wherein the second transistor is coupled is series with the first transistor, wherein the first conductivity type is different from the second conductivity type; a first majority or minority gate comprising a first capacitive input circuit, wherein first majority or minority gate is to drive the first transistor; a second majority or minority gate comprising a second capacitive input circuit, wherein second majority or minority gate is to drive the second transistor; and a threshold gate coupled to the first transistor and the second transistor.

Example 1g: An apparatus comprising: a first threshold gate to receive a first set of inputs and to generate a first output in accordance with a first threshold of the first threshold gate and in accordance with logic values of the first set of inputs; a first transistor having a first gate terminal coupled to the first output; a second threshold gate to receive a second set of inputs and to generate a second output in accordance with a second threshold of the second threshold gate and in accordance with logic values of the second set of inputs; a second transistor having a second gate terminal coupled to the second output, wherein the first transistor and the second transistor are coupled in series; and a third threshold gate coupled to the first output and a second output.

Example 2g: The apparatus of example 1g, wherein the third threshold gate is to preserve a logic value when the first transistor and the second transistor are off.

Example 3g: The apparatus of example 1g, wherein the third threshold gate is a 1-input capacitive circuit with a threshold of 1.

Example 4g: The apparatus of example 1g, wherein the third threshold gate comprises: a capacitor having a first terminal coupled to the first output, and a second terminal coupled to the second terminal; and a third transistor coupled to the second output, wherein the third transistor is controllable by a first control.

Example 5g: The apparatus of example 4g, wherein the third threshold gate comprises a fourth transistor coupled to the second output, wherein the fourth transistor is controllable by a second control, wherein the third transistor is a p-type transistor, and wherein the fourth transistor is an n-type transistor.

Example 6g: The apparatus of example 4g, wherein the capacitor comprises a paraelectric material or a ferroelectric material.

Example 7g: The apparatus of example 1g, wherein the first threshold gate, the first transistor, the second threshold gate, and the second transistor are part of an asynchronous circuit.

Example 8g: The apparatus of example 1g, wherein the first transistor is a p-type transistor, and wherein the second transistor is a n-type transistor.

Example 9g: The apparatus of example 1g, wherein the first threshold gate comprises: a first capacitor having a first terminal coupled to receive a first input of the first set of inputs, the first capacitor having a second terminal coupled to a first summing node; and a second capacitor having a third terminal coupled to receive a second input of the first set of inputs, the second capacitor having a fourth terminal coupled to the first summing node.

Example 10g: The apparatus of example 9g, wherein the first summing node is coupled to the first gate terminal of the first transistor.

Example 11g: The apparatus of example 9g, wherein the first capacitor and the second capacitor have linear dielectric.

Example 12g: The apparatus of example 1g, wherein the second threshold gate comprises: a first capacitor having a first terminal coupled to receive a first input of the second set of inputs, the first capacitor having a second terminal coupled to a second summing node; and a second capacitor having a third terminal coupled to receive a second input of the second set of inputs, the second capacitor having a fourth terminal coupled to the second summing node.

Example 13g: The apparatus of example 12g, wherein the second summing node is coupled to the second gate terminal of the second transistor.

Example 14g: The apparatus of example 12g, wherein the first capacitor and the second capacitor have linear dielectric or non-linear polar dielectric.

Example 15g: An apparatus comprising: a first transistor of a first conductivity type; a second transistor of a second conductivity type, wherein the second transistor is coupled is series with the first transistor, wherein the first conductivity type is different from the second conductivity type; a first threshold gate comprising a first capacitive input circuit, wherein the first threshold gate is to drive the first transistor; a second threshold gate comprising a second capacitive input circuit, wherein the second threshold gate is to drive the second transistor; and a third threshold gate coupled to the first transistor and the second transistor.

Example 16g: The apparatus of example 15g, wherein the first threshold gate and the second threshold gate have adjustable thresholds.

Example 17g: The apparatus of example 15g, wherein the third threshold gate has a threshold of 1.

Example 18g: The apparatus of example 15g, wherein the first capacitive input circuit includes capacitors which comprises one of: linear dielectric, paraelectric dielectric, or ferroelectric dielectric.

Example 19g: A system comprising: a memory circuitry to store one or more instructions; a processor circuitry coupled to the memory circuitry; and a communication interface coupled to the processor circuitry, wherein the processor circuitry is to execute the one or more instructions, wherein the processor circuitry includes an asynchronous circuitry, wherein the asynchronous circuitry includes: a first transistor of a first conductivity type; a second transistor of a second conductivity type, wherein the second transistor is coupled is series with the first transistor, wherein the first conductivity type is different from the second conductivity type; a first threshold gate comprising a first capacitive input circuit, wherein the first threshold gate is to drive the first transistor; a second threshold gate comprising a second capacitive input circuit, wherein the second threshold gate is to drive the second transistor; and a third threshold gate coupled to the first transistor and the second transistor.

Example 20g: The system of example 19g, wherein the first threshold gate and the second threshold gate have adjustable thresholds, and wherein the third threshold gate has a threshold of 1.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a first majority or minority gate to receive a first set of inputs and to generate a first output in accordance with a first majority or minority function of the first majority or minority gate and in accordance with logic values of the first set of inputs;
    a first transistor having a first gate terminal coupled to the first output;
    a second majority or minority gate to receive a second set of inputs and to generate a second output in accordance with a second majority or minority function of the second majority or minority gate and in accordance with logic values of the second set of inputs; and
    a second transistor having a second gate terminal coupled to the second output, wherein the second transistor is parallel to the first transistor.

2. The apparatus of claim 1 comprising:
    a third majority or minority gate to receive a third set of inputs and to generate a third output in accordance with a third majority or minority function of the third majority or minority gate and in accordance with logic values of the third set of inputs;
    a third transistor having a third gate terminal coupled to the third output; and
    a fourth transistor which is parallel to the third transistor, wherein the first transistor, the second transistor, the third transistor, and the fourth transistor are coupled to an output node.

3. The apparatus of claim 2, wherein the third majority or minority gate is 3-input majority gate, with an input tied to a power supply node.

4. The apparatus of claim 2, wherein the third transistor and the fourth transistor are of a p-type conductivity.

5. The apparatus of claim 1, wherein the first majority or minority gate is 3-input majority gate, with an input tied to a ground supply node.

6. The apparatus of claim 1, wherein the second majority or minority gate is a 5-input majority gate with two inputs tied to a ground supply node.

7. The apparatus of claim 1, wherein the first transistor and the second transistor are of n-type conductivity.

8. The apparatus of claim 2, wherein the first majority or minority gate, the first transistor, the second majority or minority gate, the second transistor, the third majority or minority gate, the third transistor, and the fourth transistor are part of an asynchronous circuit.

9. The apparatus of claim 2 comprises a memory circuitry coupled to the output node.

10. The apparatus of claim 9, wherein the memory circuitry includes a first inversion circuitry and a second inversion circuitry, and wherein the first inversion circuitry is coupled to the second inversion circuitry in a ring configuration.

11. The apparatus of claim 1, wherein the first majority or minority gate comprises:
   a first capacitor having a first terminal coupled to receive a first input of the first set of inputs, the first capacitor having a second terminal coupled to a first summing node; and
   a second capacitor having a third terminal coupled to receive a second input of the first set of inputs, the second capacitor having a fourth terminal coupled to the first summing node.

12. The apparatus of claim 11, wherein the first summing node is coupled to the first gate terminal of the first transistor.

13. The apparatus of claim 11, wherein the first capacitor and the second capacitor have linear dielectric.

14. The apparatus of claim 11, wherein the first capacitor and the second capacitor have non-linear polar dielectric.

15. The apparatus of claim 14, wherein the non-linear polar dielectric includes one or more of:
   Bismuth ferrite (BFO) with a doping material, wherein the doping material is one of Lanthanum, or elements from lanthanide series of periodic table;
   Lead zirconium titanate (PZT) or PZT with a doping material, wherein the doping material is one of La or Nb;
   a relaxor ferroelectric which includes one of: lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
   a perovskite which includes one of: BaTiO3, PbTiO3, KNbO3, or NaTaO3;
   a hexagonal ferroelectric which includes one of: YMnO3 or LuFeO3;
   hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
   Hafnium (Hf), Zirconium (Zr), Aluminum (Al), Silicon (Si), their oxides or their alloyed oxides;
   Hafnium oxides as Hf1-x Ex Oy, where E can be Al, Ca, Ce, Dy, Er, Gd, Ge, La, Sc, Si, Sr, Sn, or Y;
   Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' or 'y' is a fraction;
   Niobate type compounds LiNbO3, LiTaO3, Lithium iron Tantalum Oxy Fluoride, Barium Strontium Niobate, Sodium Barium Niobate, or Potassium strontium niobate; or
   an improper ferroelectric which includes one of: [PTO/STO]n or [LAO/STO]n, where 'n' is between 1 to 100.

16. The apparatus of claim 14, wherein the non-linear polar dielectric includes one or more of: SrTiO3, Ba(x)Sr(y)TiO3 , HfZrO2, Hf—Si—O, BaTiO3, La-substituted PbTiO3, lead zirconate titanate, or PMN-PT (lead magnesium niobate-lead titanate) based relaxor ferroelectrics.

17. An apparatus comprising:
   a first set of transistors of a first conductivity type, wherein the first set of transistors are parallel to one another and coupled to a first supply rail and an output node, wherein the apparatus further comprises:
   a second set of transistors of a second conductivity type, wherein the second set of transistors are parallel to one another and coupled to a second supply rail and the output node, wherein the apparatus further comprises:
   a first majority or minority gate to receive a first set of inputs and to generate a first output in accordance with a first majority or minority function of the first majority or minority gate and in accordance with logic values of the first set of inputs, wherein the first output is to drive an individual transistor of the first set of transistors.

18. The apparatus of claim 17 comprises:
   a second majority or minority gate to receive a second set of inputs and to generate a second output in accordance with a second majority or minority function of the second majority or minority gate and in accordance with logic values of the second set of inputs, wherein the second output is to drive an individual transistor of the second set of transistors.

19. The apparatus of claim 18, wherein the first majority or minority gate is an OR gate, and wherein the second majority or minority gate is a AND gate.

20. A system comprising:
   a memory circuitry to store one or more instructions;
   a processor circuitry coupled to the memory circuitry; and
   a communication interface coupled to the processor circuitry, wherein the processor circuitry is to execute the one or more instructions, wherein the processor circuitry includes an asynchronous circuitry, wherein the asynchronous circuitry includes:
   a first set of transistors of a first conductivity type, wherein the first set of transistors are parallel to one another and coupled to a first supply rail and an output node, wherein the asynchronous circuitry further comprises:
   a second set of transistors of a second conductivity type, wherein the second set of transistors are parallel to one another and coupled to a second supply rail and the output node, wherein the asynchronous circuitry further comprises:
   a first majority or minority gate to receive a first set of inputs and to generate a first output in accordance with a first majority or minority function of the first majority or minority gate and in accordance with logic values of the first set of inputs, wherein the first output is to drive an individual transistor of the first set of transistors.

* * * * *